US011509079B2

(12) United States Patent
Tsai et al.

(10) Patent No.: US 11,509,079 B2
(45) Date of Patent: Nov. 22, 2022

(54) BLIND MATE CONNECTIONS WITH DIFFERENT SETS OF DATUMS

(71) Applicant: HEWLETT PACKARD ENTERPRISE DEVELOPMENT LP, Houston, TX (US)

(72) Inventors: Pinche Tsai, Richardson, TX (US); Minh Nguyen, Katy, TX (US); David A. Selvidge, Cypress, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 332 days.

(21) Appl. No.: 16/841,594

(22) Filed: Apr. 6, 2020

(65) Prior Publication Data

US 2021/0313720 A1   Oct. 7, 2021

(51) Int. Cl.
| | |
|---|---|
| *H01R 12/00* | (2006.01) |
| *H01R 12/70* | (2011.01) |
| *H01R 13/15* | (2006.01) |
| *H05K 7/14* | (2006.01) |
| *H05K 1/18* | (2006.01) |

(52) U.S. Cl.
CPC ......... *H01R 12/7005* (2013.01); *H01R 13/15* (2013.01); *H05K 1/181* (2013.01); *H05K 7/1439* (2013.01); *H05K 7/1489* (2013.01); *H05K 2201/10189* (2013.01); *H05K 2201/2036* (2013.01)

(58) Field of Classification Search
CPC .... H01R 12/7005; H01R 13/15; H05K 1/181; H05K 7/1439; H05K 7/1489; H05K 2201/10189; H05K 2201/2036

USPC .......................................................... 439/64
See application file for complete search history.

(56) References Cited

U.S. PATENT DOCUMENTS

| | | | |
|---|---|---|---|
| 6,469,899 B2 * | 10/2002 | Hastings .............. | H05K 7/1489 248/65 |
| 7,217,040 B2 | 5/2007 | Crews et al. | |
| 7,510,336 B2 | 3/2009 | Sakaji et al. | |

(Continued)

FOREIGN PATENT DOCUMENTS

WO    WO-2005047946          5/2005

*Primary Examiner* — Abdullah A Riyami
*Assistant Examiner* — Vladimir Imas
(74) *Attorney, Agent, or Firm* — Nolte Intellectual Property Law Group

(57) ABSTRACT

Blind mate connection techniques and associated connectors are disclosed. Blind mate connectors provide connections where visual inspection at time of connection may not be available. Stacking tolerance increases when connectors have a different set of datums (e.g., a different relative orientation) relative to adjacent connectors. Different datums permit twinning two printed circuit boards ("PCBs") prior to insertion into a slot of a chassis. Each connector may be attached to a respective PCB utilizing a spring and offset feature to provide a standoff on a respective PCB. Control of standoff and rotational movement (e.g., via brackets) allows each individual connector to have a "float" for improved insertion tolerance. Connector pairs may connect through an opening in a midplane while simultaneously connecting to the midplane. Switch trays and node trays may be inserted through opposing sides of a chassis and be connected through the midplane of that chassis.

19 Claims, 18 Drawing Sheets

(56) References Cited

U.S. PATENT DOCUMENTS

| | | | | |
|---|---|---|---|---|
| 8,348,680 B2* | 1/2013 | McClellan | H05K 7/1461 439/79 |
| 8,684,610 B2* | 4/2014 | Nichols | H01R 13/62911 439/296 |
| 8,702,318 B2* | 4/2014 | Isenhour | G02B 6/32 385/71 |
| 8,864,516 B2* | 10/2014 | Herring | H05K 7/1451 439/502 |
| 8,888,531 B2* | 11/2014 | Jeon | H01R 13/658 439/607.07 |
| 8,992,099 B2* | 3/2015 | Blackwell, Jr. | G02B 6/4277 385/88 |
| 8,995,812 B2* | 3/2015 | Ciechomski | G02B 6/4452 385/139 |
| 9,075,217 B2* | 7/2015 | Giraud | G02B 6/4452 |
| 9,125,318 B2* | 9/2015 | French, Jr. | H05K 7/1489 |
| 9,173,304 B2* | 10/2015 | French, Jr. | H05K 3/368 |
| 9,176,284 B2 | 11/2015 | Megason | |
| 9,279,951 B2* | 3/2016 | McGranahan | G02B 6/4452 |
| 9,312,637 B2 | 4/2016 | Simpson et al. | |
| 9,335,786 B2* | 5/2016 | Stewart | G06F 1/16 |
| 9,380,728 B1* | 6/2016 | Dunwoody | H05K 7/1487 |
| 9,519,118 B2* | 12/2016 | Giraud | G02B 6/4454 |
| 9,678,544 B2* | 6/2017 | Stewart | H05K 7/1489 |
| 9,720,184 B2* | 8/2017 | Benner | G02B 6/4292 |
| 9,723,744 B1* | 8/2017 | Fricker | H05K 7/1492 |
| 9,723,756 B1* | 8/2017 | Masters | H05K 7/1489 |
| 9,730,313 B2* | 8/2017 | Gailus | H05K 1/0216 |
| 9,730,356 B2* | 8/2017 | Franz | G11B 33/1426 |
| 9,730,357 B2* | 8/2017 | Simpson | H05K 7/1492 |
| 9,735,481 B2 | 8/2017 | Costello et al. | |
| 9,775,231 B2* | 9/2017 | Cartier, Jr. | H05K 3/4038 |
| 9,910,228 B2* | 3/2018 | Leigh | G02B 6/3878 |
| 10,080,303 B2* | 9/2018 | Franz | H05K 7/1489 |
| 10,136,196 B2* | 11/2018 | Ritter | H04Q 1/15 |
| 10,165,703 B1* | 12/2018 | Adrian | H05K 7/1491 |
| 10,251,302 B2* | 4/2019 | Bachar | H05K 7/1488 |
| 10,299,413 B2* | 5/2019 | Cui | H05K 7/1487 |
| 10,310,568 B2* | 6/2019 | Stewart | H05K 7/1489 |
| 10,338,324 B2 | 7/2019 | Otomitsu | |
| 10,440,850 B2* | 10/2019 | Zhang | H05K 7/1449 |
| 10,462,926 B2* | 10/2019 | Gold | H05K 7/20709 |
| 10,476,670 B2* | 11/2019 | Schmisseur | H04L 47/125 |
| 10,499,536 B1* | 12/2019 | Simpson | H05K 7/20718 |
| 10,709,034 B2* | 7/2020 | Jochim | H05K 7/1495 |
| 10,725,252 B1* | 7/2020 | Leigh | G02B 6/406 |
| 10,754,103 B2* | 8/2020 | Leigh | H01R 13/4538 |
| 10,863,644 B1* | 12/2020 | Tseng | H05K 7/1487 |
| 10,881,030 B1* | 12/2020 | Lunsman | H05K 7/1487 |
| 10,888,016 B2* | 1/2021 | Jensen | H05K 7/20209 |
| 10,939,582 B2* | 3/2021 | Mercier | H01R 12/7005 |
| 11,025,411 B2* | 6/2021 | Guim Bernat | G06F 13/1663 |
| 11,030,017 B2* | 6/2021 | Kumar | H04L 41/0816 |
| 11,050,554 B2* | 6/2021 | Sundar | H04L 41/0677 |
| 11,055,149 B2* | 7/2021 | Balle | B25J 15/0014 |
| 11,177,618 B1* | 11/2021 | Tunks | H05K 7/1492 |
| 11,199,669 B1* | 12/2021 | Leigh | G02B 6/4277 |
| 11,201,420 B2* | 12/2021 | Lu | H01R 12/7005 |
| 11,249,816 B2* | 2/2022 | Aoki | G11C 29/38 |
| 2009/0324176 A1* | 12/2009 | Cheng | G02B 6/3885 385/73 |
| 2015/0116923 A1* | 4/2015 | Skirmont | H05K 7/1492 361/679.31 |
| 2016/0043507 A1* | 2/2016 | Rossman | H01R 13/65912 174/72 A |
| 2016/0234961 A1* | 8/2016 | Myrto | H05K 7/1445 |
| 2017/0257970 A1* | 9/2017 | Alleman | G06F 1/20 |
| 2019/0141845 A1* | 5/2019 | Prakash | H05K 7/1492 |
| 2021/0051814 A1* | 2/2021 | Carver | H05K 7/1489 |

* cited by examiner

BLIND MATE CONNECTIONS WITH DIFFERENT SETS OF DATUMS

BACKGROUND

Computer devices typically include one or more printed circuit boards ("PCBs") that may be connected to each other or to other devices via connectors. In some cases, connectors are connected when they are visible during the connection process. In other cases, the connectors may slide together while they are not visible (or not completely visible). This second case for connectors is typically referred to as a "blind mate" connector (i.e., because the connectors mate when they are not visible). Further, each connector may have a datum that is associated with an orientation of that connector. If two identical connectors are oriented the same direction, they maintain a single datum. However, as explained further below, if two identical connectors have different orientations (e.g., offset by 180 degrees relative to each other), then they have different datums.

Structurally, a blind mate connector may be no different than an ordinary connector. However, to assist in establishing an out-of-view connection, some blind mate connectors include one or more connection aids to assist in aligning two connectors (e.g., a male connector and a female connector) at the time of coupling. Connection aids may include connection guides in the form of chamfers (bevels), grooves, springs and standoffs, etc. Once connected, a blind mate connector provides a computer connection that may be functionally equivalent to an ordinary connector. That is, the attributes that make the connector a blind mate connector easier to connect do not typically add post-connection capabilities to the established connection.

Server chassis (sometimes called racks) may include "drawers" that slide into the chassis from the front and/or the back. In this context, a drawer refers to a set of computer components physically grouped together for insertion into a server chassis. In some cases, as part of sliding a drawer into a chassis, blind mate connections are formed to a chassis back-plane (a PCB at the back of the server chassis) or a chassis mid-plane (a PCB at a mid-point of the server chassis). When a sever chassis has a mid-plane, sometimes drawers may be slid into the chassis from both the front and the back of the chassis.

BRIEF DESCRIPTION OF THE DRAWINGS

The present disclosure may be better understood from the following detailed description when read with the accompanying Figures. It is emphasized that, in accordance with standard practice in the industry, various features are not drawn to scale. In fact, the dimensions or locations of functional attributes may be relocated or combined based on design, security, performance, or other factors known in the art of computer systems. Further, order of processing may be altered for some functions, both internally and with respect to each other. That is, some functions may not require serial processing and therefore may be performed in an order different than shown or possibly in parallel with each other. For a detailed description of various examples, reference will now be made to the accompanying drawings, in which.

DETAILED DESCRIPTION

Illustrative examples of the subject matter claimed below will now be disclosed. In the interest of clarity, not all features of an actual implementation are described for every example implementation in this specification. It will be appreciated that in the development of any such actual example, numerous implementation-specific decisions may be made to achieve the developer's specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

This disclosure describes a blind mate connection technique implemented with connector pairs to establish an electrical connection (e.g., for data communication and/or power) between multiple electronics within the same chassis. Each connector pair may have a male connector that mates with an associated female connector. In one example, a set of male connectors may be provided for a node-side connection and a set of female connectors (each to mate with an associated male connector) may be provided for a switch-side. Thus, node PCBs within a node tray may be connected, via the disclosed blind mate connection technique, to switch PCBs within a switch tray where both the node tray and the switch tray are inserted into a single chassis (e.g., a server chassis). In disclosed implementations, the connection between node trays and switch trays is formed through openings of a mid-plane of the server chassis such that each of the trays may concurrently connect to the mid-plane and the respective connector of a tray on the opposite side of the mid-plane.

While examples of this disclosure indicate that a male connector with "float" is included on a node-side connection and a fixed female connector is provided on the switch-side connection, the opposite association (or other alternate permutations) may also be provided. That is, disclosed techniques may allow for a float on a female connector or may provide float for both male and female connectors. Further, it is possible to have male connectors on either the node-side or the switch-side with a corresponding female connector on the other side. Determination of which connectors are male versus female and which connectors are fixed versus having some degree of float may be a design time consideration.

Figure 1A:
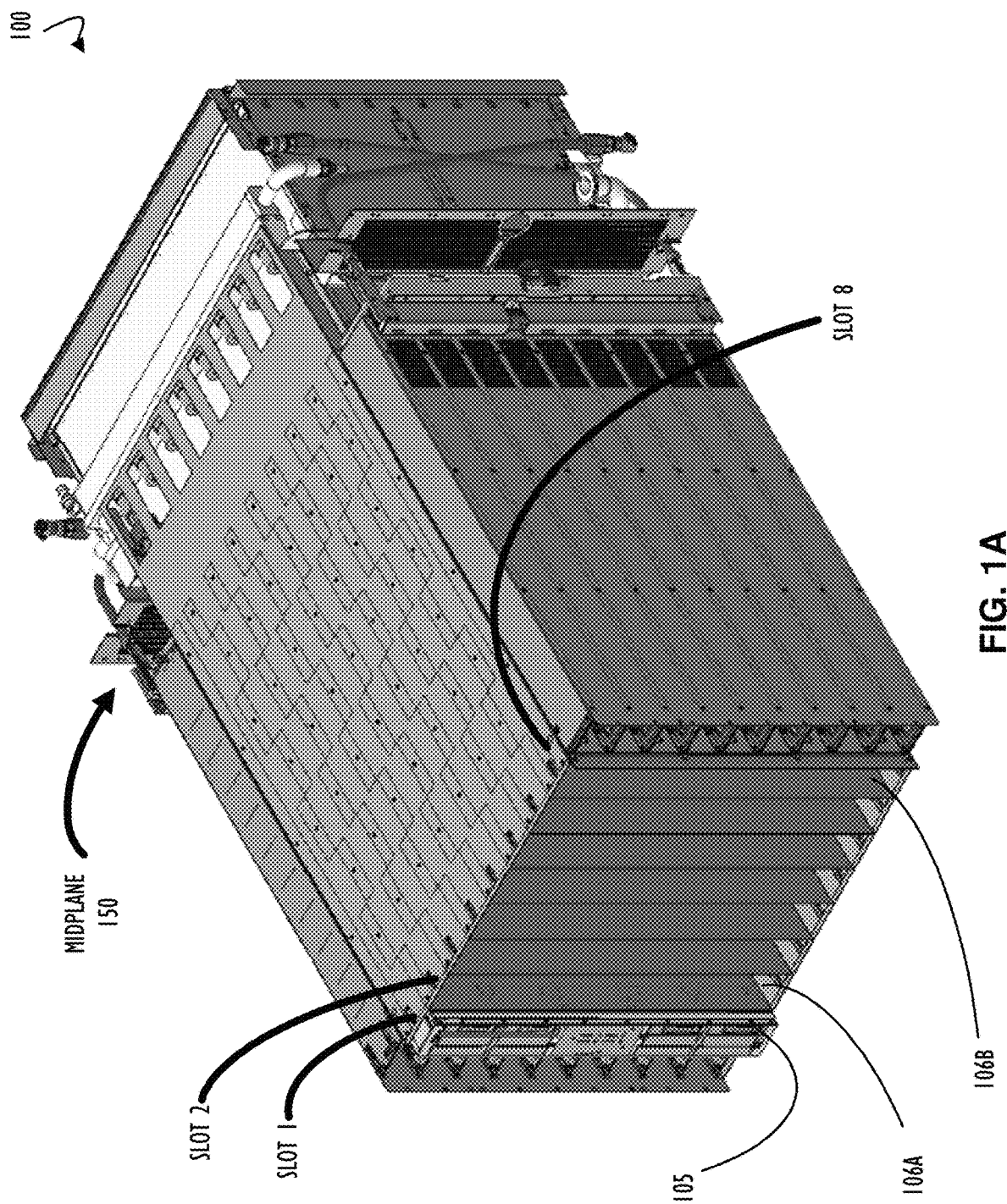
FIGS. 1A-D illustrate an example of a chassis to receive node trays and switch trays such that node trays and switch trays are offset at 90 degrees relative to each other and meet at a midplane of the chassis, according to one or more disclosed implementations.

Referring now to FIGS. 1A-D. As illustrated in FIG. 1A, chassis 100 includes midplane 150 at a mid-point within the internal space defined by chassis 100. FIG. 1A illustrates a perspective view of chassis 100 where slot 1 (including node tray 105), slot 2 (opening 106A), and on through slot 8 (opening 106B), are to the left of FIG. 1A. Note that the orientation of each node tray 105 relative to chassis 100 may be considered to have a vertical orientation relative to the force of gravity.

Figure 1B:
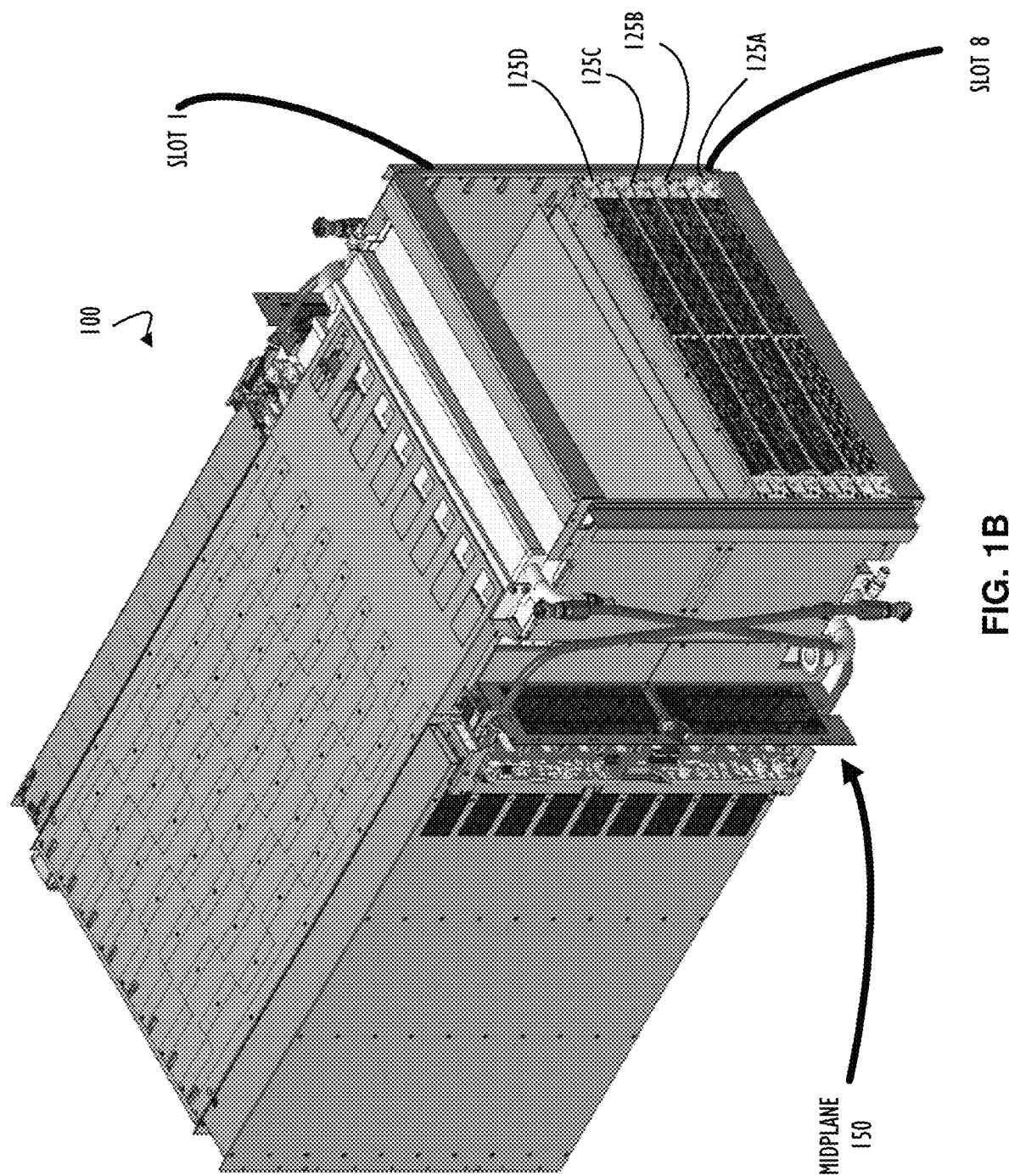

Turning to FIG. 1B, chassis 100 is illustrated at a rotated (relative to a horizontal axis of chassis 100 relative to the force of gravity) perspective view relative to that illustrated in FIG. 1A. In FIG. 1B, chassis 100 continues to illustrate midplane 150 at a mid-point of chassis 100 but shows an opposite side of chassis 100 from that of FIG. 1A. Specifically, FIG. 1B illustrates chassis 100 with four switch trays 125A-D included in the bottom four slots of the eight illustrated slots on the switch tray side of chassis 100. As illustrated in FIG. 1B, slot 1 is shown to be empty and slots 5-8 are shown to respectively include switch trays 125A-D (i.e., switch tray 125A is in slot 8, switch tray 125B is in slot 7, switch tray 125C is in slot 6, and switch tray 125D is in slot 5). Note that the orientation of each switch tray 125A-D relative to chassis 100 may be considered to have a horizontal orientation. Thus, each switch tray is offset at 90 degrees relative to each node tray (as illustrated in FIG. 1A).

Figure 1C:
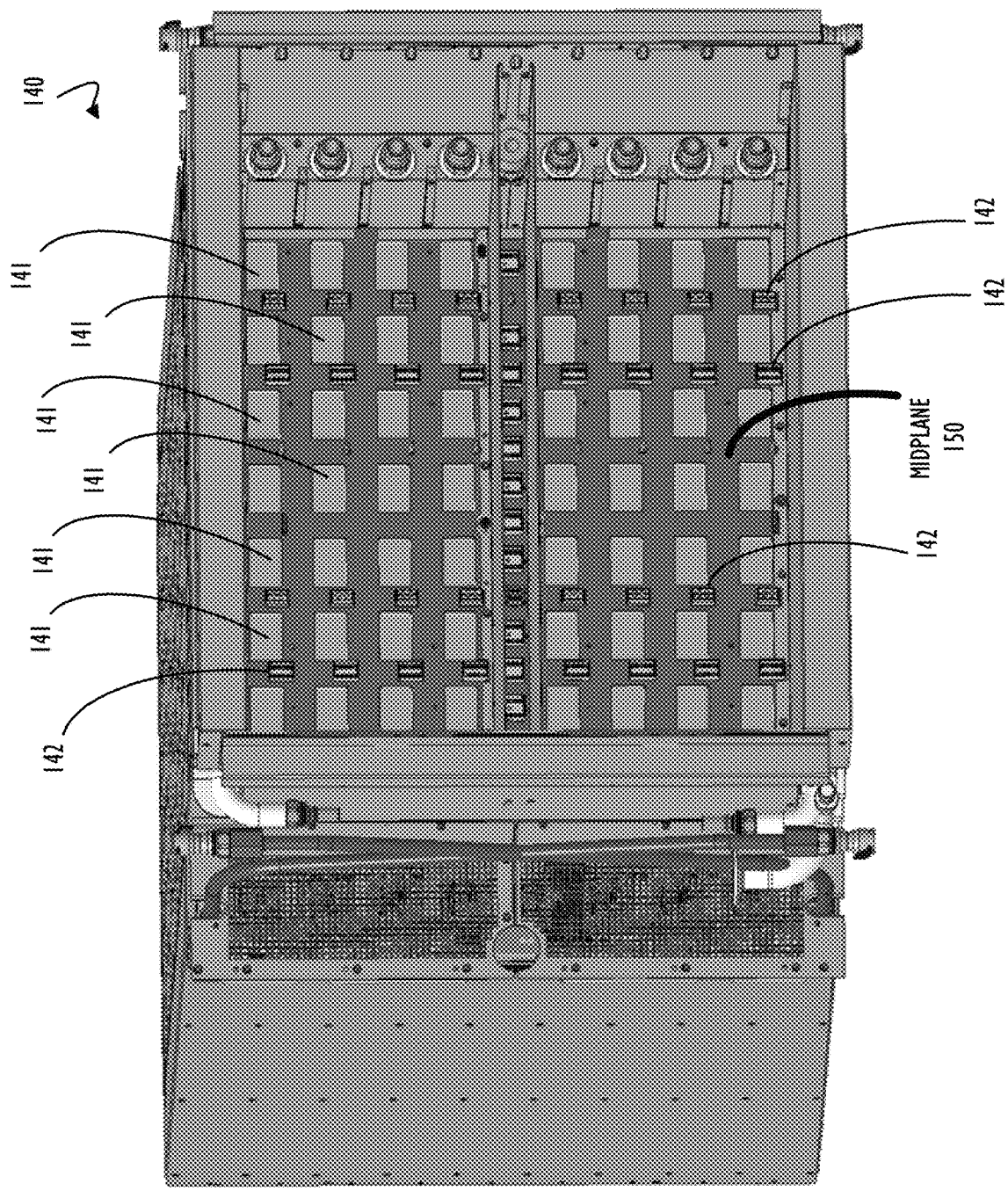
Figure 1D:
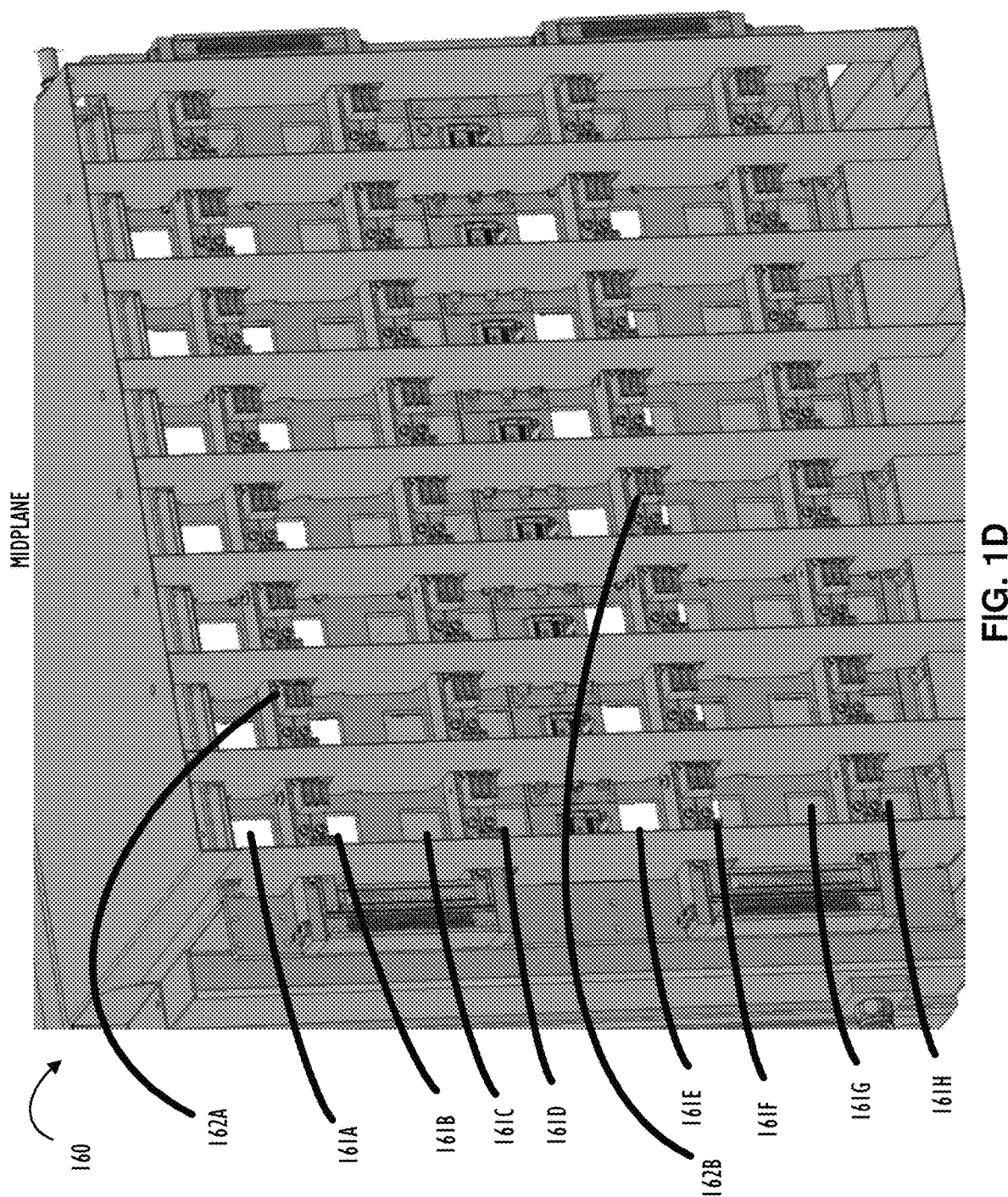

Each of FIGS. 1C and 1D illustrate different views of midplane 150. In FIG. 1C, view 140 illustrates an internal view of chassis 100 showing midplane 150. As illustrated, midplane 150 includes multiple openings 141 that correspond to locations where connectors may extend from a tray that would be inserted, like a drawer, into chassis 100. Trays in this example may be similar to switch tray 125 and node tray 105 of previous examples. Midplane 150 also includes multiple connectors 142 that are part of midplane 150 and adjacent to one or more of the openings 141. In this manner, upon insertion of a switch tray (or possibly a node tray in another example) the blind mate connectors that are part of the switch tray (see FIG. 4 and FIG. 9) may align with each opening in midplane 150 while concurrently attaching to midplane 150 (e.g., attaching to connectors 142). That is, a switch tray may, in this example, provide female connectors to align with each opening 141 and connect to midplane 150 upon insertion (i.e., midplane connector 910 of FIG. 9 may connect to one of connectors 142).

FIG. 1D illustrates a view 160 of midplane 150 from the opposite side of that shown in FIG. 1C. To further illustrate the concept of concurrent connection between trays and midplane 150, each of openings 161A-H may be associated with twinned male connectors from a node tray (i.e., node tray 105 of FIG. 1A that is further shown in FIG. 2A, and FIGS. 5-6). Specifically, a pair of male connectors from a twinned set of PCBs may provide a connection for a node-tray that is inserted into the top slot of a chassis 100 to align with opening 161A. Upon insertion and alignment with opening 161A (for the male blind mate connectors), at least one additional connection between the node-tray and the midplane may be formed via connector 162A.

Similarly, a different node-tray may, upon insertion, form a connection with connector 162B. Other connectors are shown for midplane 150 in view 160 but are not specifically numbered. In this manner (and as illustrated in FIG. 1C), trays may form a concurrent blind mate connection with each other through openings of midplane 150 while concurrently connecting to the midplane 150 of chassis 100. Connections from midplane 150 to each tray may provide for electrical power, data communication, cooling capabilities, or other functions that midplane 150 may be configured to provide to associated trays upon insertion and connection. A node-tray and a switch-tray (neither of which is shown in FIG. 1C or FIG. 1D) would connect to each other through a set of openings (e.g., 161A-H) that correspond with an orientation of a respective tray.

Figure 2A:
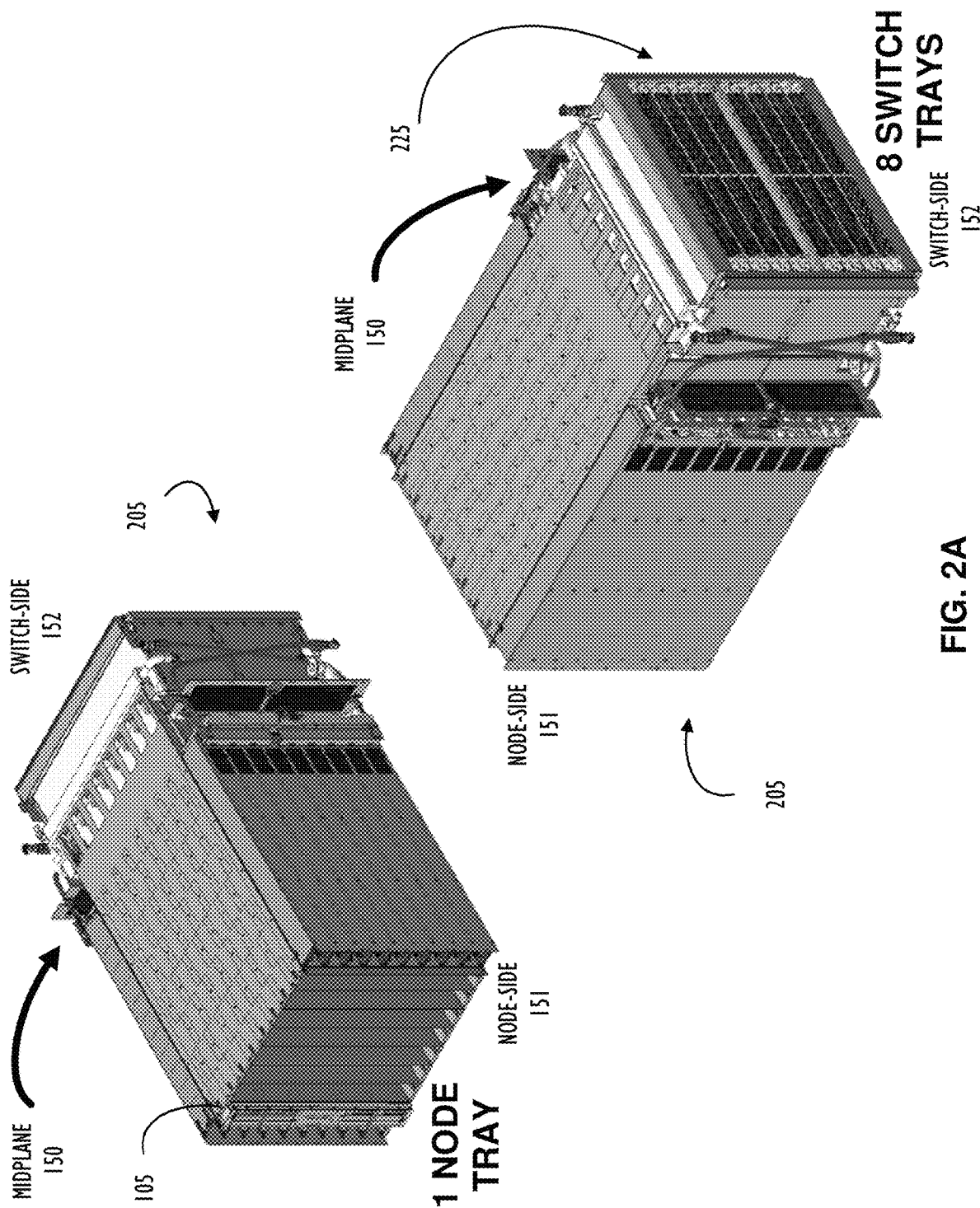
FIGS. 2A-B illustrate possible combinations of different numbers of node trays and switch trays to support different operational configurations of a chassis similar to the chassis of FIGS. 1A-D, according to one or more disclosed implementations.

Referring now to FIG. 2A, chassis 205 (which is another example of chassis 100) is illustrated from two different perspectives to illustrate a first node tray 105 and eight (8) switch trays 225. The top perspective view of FIG. 2A illustrates chassis 205 with node-side 151 visible and switch-side 152 obscured from view. The bottom perspective view of FIG. 2A illustrates chassis 205 with switch-side 152 visible and node-side 151 obscured from view. Note that because of the different relative orientations of node trays and switch trays (as explained above 90 degree offset), node tray 105 connects (as described further below) concurrently with each of the eight switch trays 225 and midplane 150. Stated another way, a compute node provided within components of a node tray such as node tray 105 may connect to eight different switch trays 225 and their respective components within a single chassis 205 and thus provide network throughput from that compute node through eight different switches.

Figure 2B:
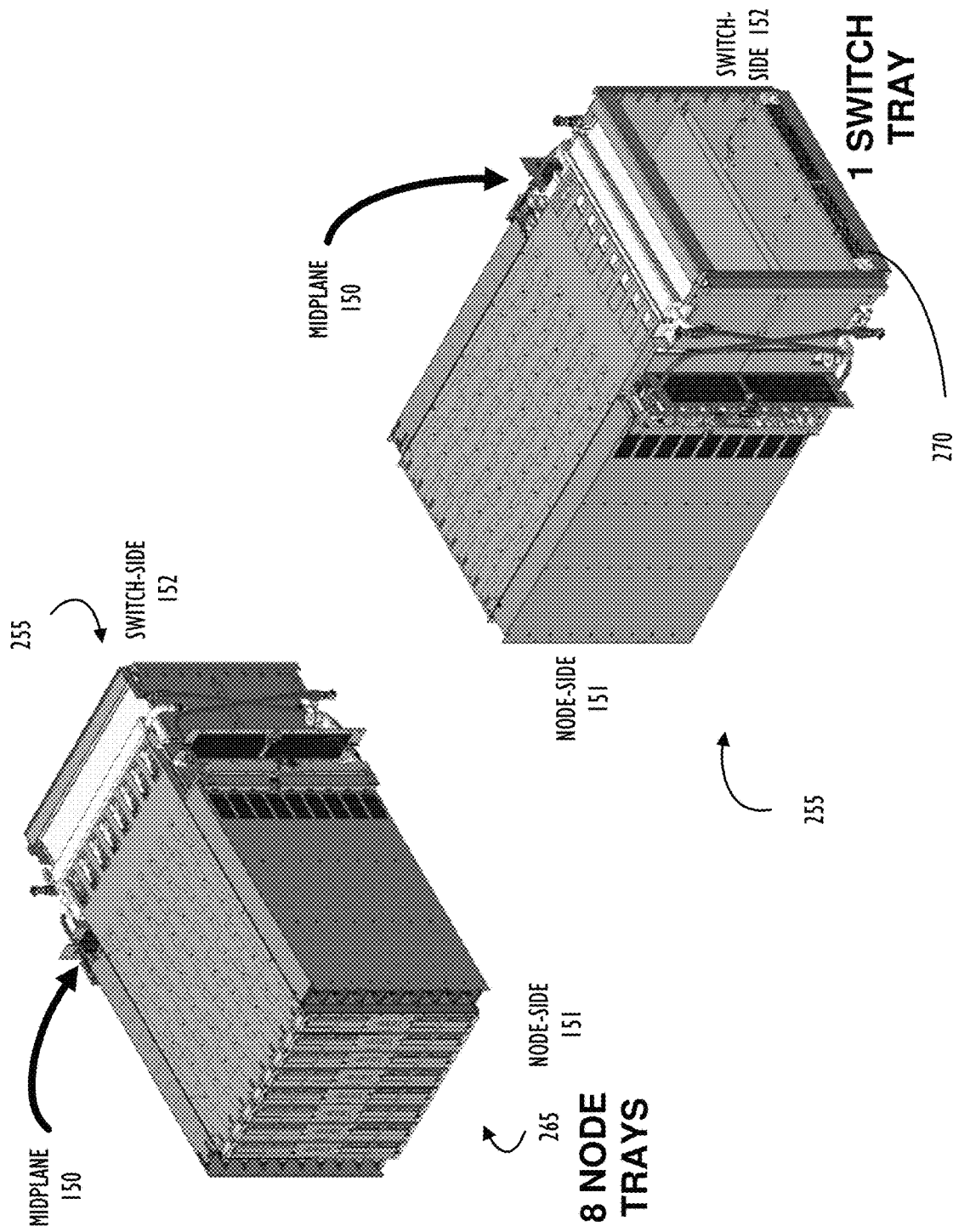

Referring now to FIG. 2B, chassis 205 is again illustrated from two different perspective views and configured differently than shown in FIG. 2A. Specifically, in FIG. 2B, chassis 205 is illustrated with eight (8) node trays 265 and a single switch tray 270. In this configuration each of the eight (8) node trays 265 may connect to a network via connectivity provided by components (not shown) of switch tray 270. Each of node trays 265 will have a single "pass-through" connection to switch tray 270 via an opening in midplane 150 as explained above. Again, each of node trays 265 and switch tray 270 may also have a concurrent connection to midplane 150. Other numbers of node trays and switch trays are also possible and FIGS. 2A-B illustrate only some examples. Specifically, any number 1 through 8 of node trays may be included in a chassis (e.g., 100, 205) and concurrently connect to any number 1 through 8 of switch trays. The number of node trays and switch trays included in a single chassis may be determined based on an amount of compute resource and network resource to be realized within that chassis.

Figure 3A:
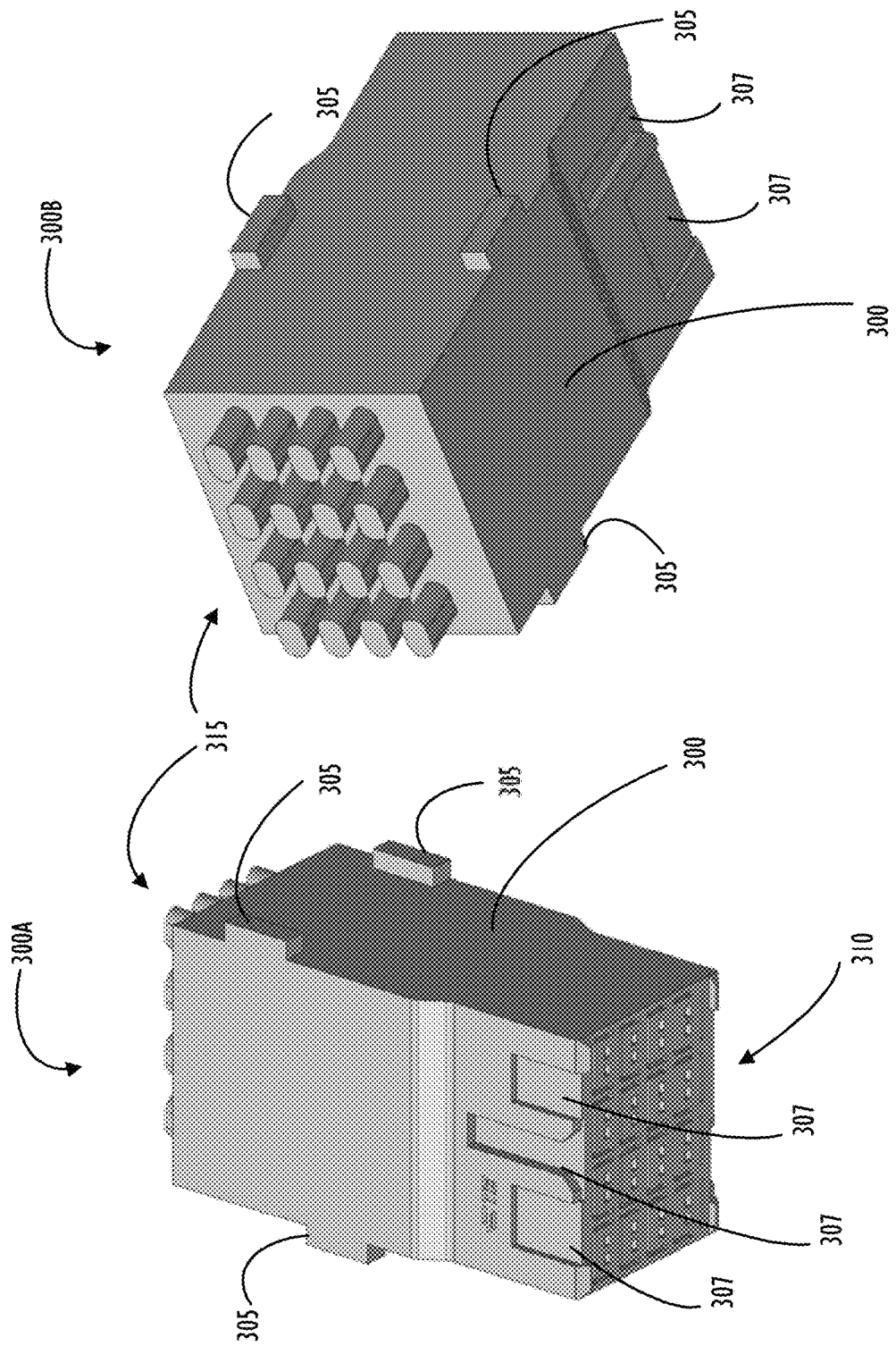
FIG. 3A illustrates an example of a connector that may be a base component of a node-side connection for the disclosed blind mate connections with different sets of datums, according to one or more disclosed implementations.

Referring now to FIG. 3A, connector 300 (in this example a Whisper connector) is illustrated from a first perspective 300A with female connection points illustrated at a front face 310 of connector 300. Perspective 300B illustrates the back side connectivity points 315 that allow connector 300 to connect to a PCB (not shown). In this example, connector 300 includes tabs 305 and grooves 307 that may be used for alignment and connection to a node-housing 320 (explained below with reference to FIG. 3B). Note, in this example, there are two housings to hold connectors. The use of the term "node-housing" as in node-housing 320 is used to identify the housing on the node-side and differentiate that housing from the housing that holds the connector on the switch-side which is referred to as a switch-housing (i.e., switch-housing 355 discussed below).

Figure 3B:
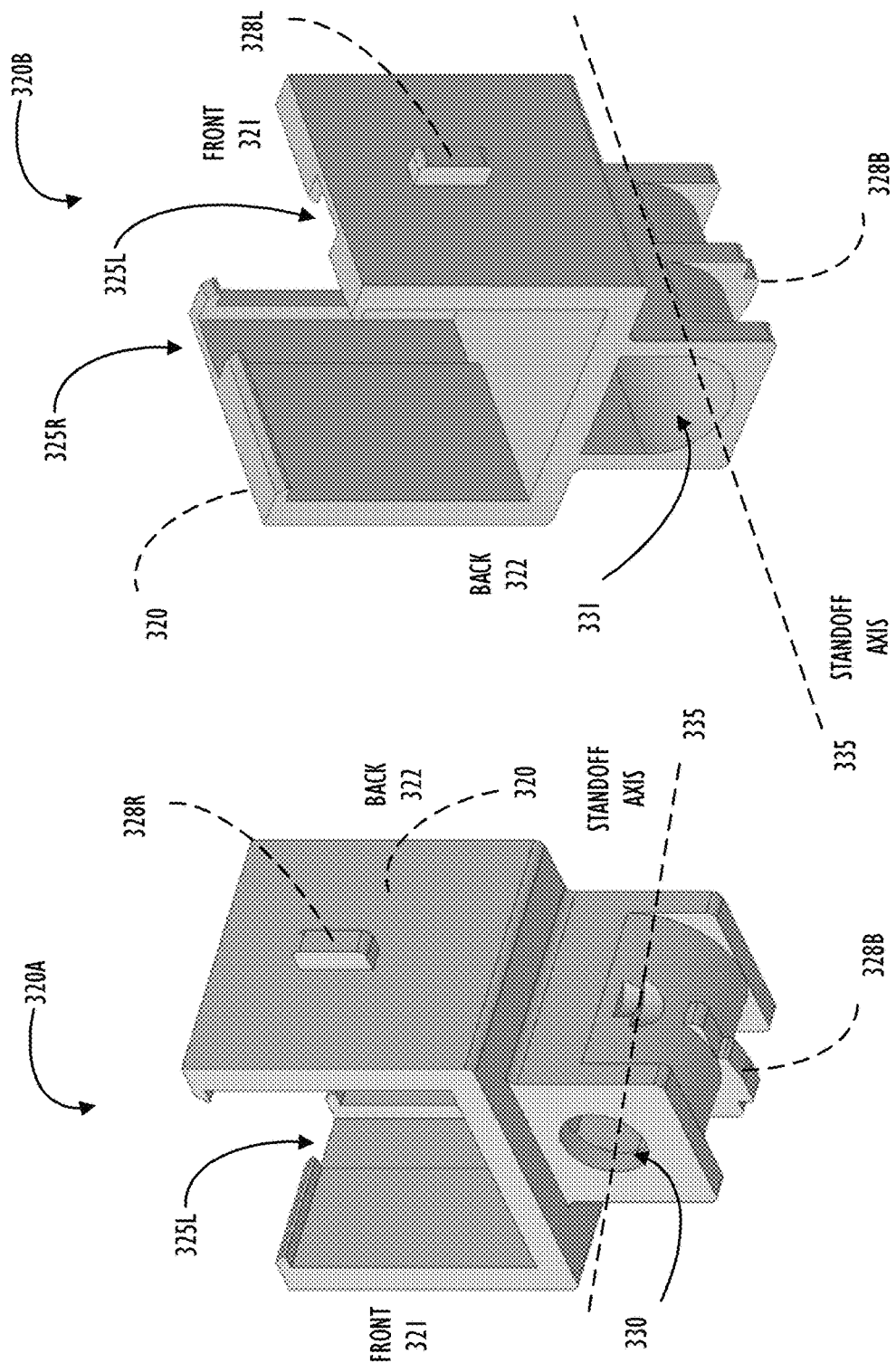
FIG. 3B illustrates a node-housing for the connector of FIG. 3A, according to one or more disclosed implementations.

Referring now to FIG. 3B, node-housing 320 is illustrated from a first perspective view 320A illustrating the front 321 of connector 300 at the left-side. The back 322 of node-housing 320 is illustrated at the right-side. Perspective view 320B illustrates back 322 of node-housing 320 at the left-side and front 321 at the right-side. Thus, views 320A and 320B illustrate node-housing 320 rotated approximately 180 degrees from each other.

As illustrated, node-housing 320 includes tabs 328R and 328L on a right-side and left-side respectively. Node-housing 320 further includes tab 328B at a bottom of node-housing 320. Grooves 325R (on a right-side of node-housing 320) and 325L (on a left-side of node-housing 320) may align with one or more tabs 305 of connector 300 as illustrated in FIG. 3A. Each of views 320A-B also illustrate standoff axis 335 that will be explained further below (see FIG. 5) where insertion of a standoff, screw, and spring (not shown, see FIG. 3D) may be inserted to facilitate attachment of node-housing 320 to a PCB. As explained below, a spring and standoff (not shown) may be inserted via opening 331 of node-housing 320 and a screw (also not shown) may be provided through opening 330 to provide an attachment with a pre-determined amount of "float" for node-housing 320 and its associated connector 300. In general, standoff axis 335 will be directed toward a printed circuit board ("PCB") for which the connector is attached such that node-housing 320 may be along an edge of the PCB. In this manner, pushing two trays toward each other (with an intervening mid-plane) may allow connectors from each of the two trays to connect with each other while also forming a connection to the mid-plane.

Figure 3C:
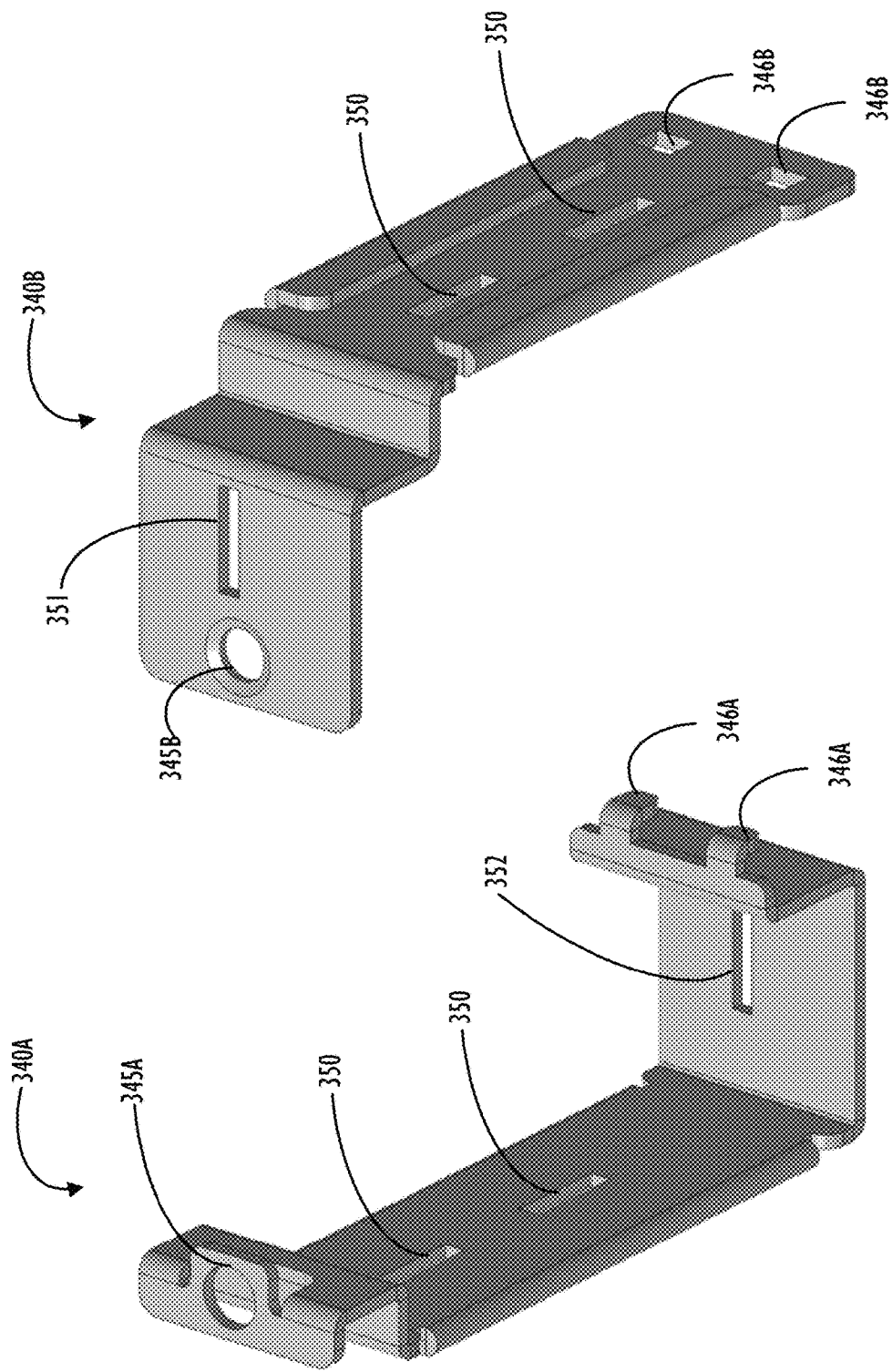
FIG. 3C illustrates a pair of brackets that may be used to control rotational movement of a twinned pair of blind mate connectors and/or their respective housings, according to one or more disclosed implementations.

Referring now to FIG. 3C, complementary brackets 340A and 340B are illustrated. In use, each of these brackets will form a perimeter around node-housing 320 as discussed further below to assist in controlling rotational movement that may otherwise be permitted by a spring (not shown) and standoff (not shown) around standoff axis 335. Bracket 340A includes hooks 346A which will connect to bracket 340B via holes 346B. Side holes 350 on each of bracket 340A and bracket 340B are openings, that upon assembly, may align with one of tabs 328R or 328L of node-housing 320 (as illustrated in FIG. 3B). Top hole 351 and bottom hole 352 may align with a tab 328B of node-housing 320 (as illustrated in FIG. 3B).

To be clear, brackets 340A and 340B as illustrated in FIG. 3C are an example of brackets to surround two instances of node-housing 320 simultaneously with each instance of node-housing 320 being flipped by 180 degrees relative to its associated "sister" node-housing 320. As explained further below, this orientation occurs as part of "twinning" two PCBs to form a tray (in this example a node tray).

FIG. 3C also illustrates that bracket 340B includes screw hole 345B and bracket 340A includes screw hole 345A. Thus, when a pair of brackets 340A and 340B surround a pair of node-housings 320, hooks 346A, holes 346B, and screw holes 345A-B provide structural connection to "wrap" the two node-housings 320. By being wrapped together in this manner, rotational movement around standoff axis 335 may be limited based on amount of external pressure supplied by the pair of brackets 340A and 340B. The amount of external pressure, and therefore the amount of rotational resistance, may be increased by using pairs of brackets 340A and 340B that fit more tightly together or are made of more rigid materials. If more rotational movement is desired (via less rotational restriction), looser fitting or more flexible brackets 340A and 340B may be used.

Figure 3D:
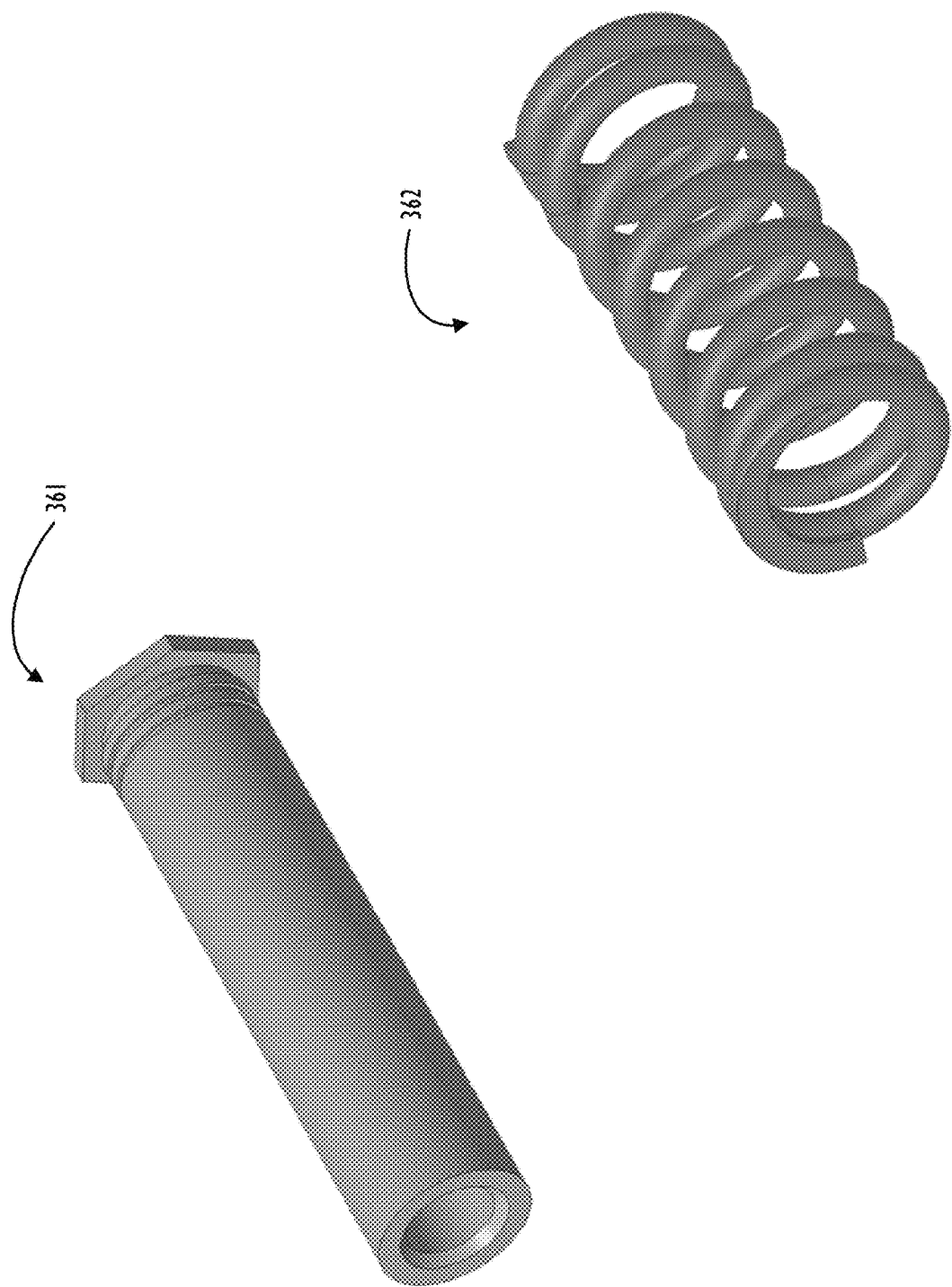
FIG. 3D illustrates an example spring and standoff that may be used to control lateral movement of a twinned pair of blind mate connectors, according to one or more disclosed implementations.
Figure 5:
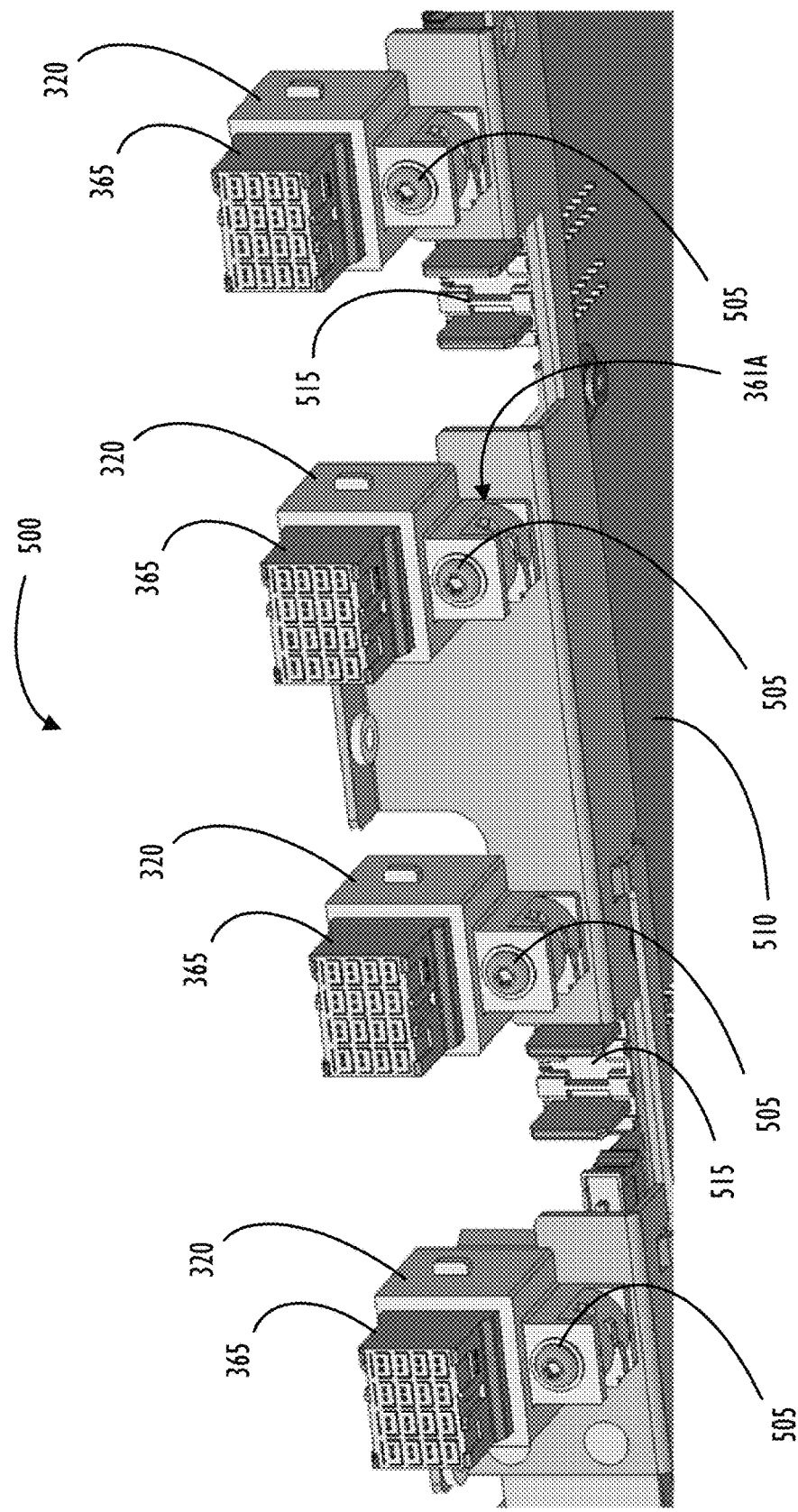
FIG. 5 illustrates an un-twinned (i.e., single) PCB of a node-side tray having male blind mate connectors (e.g., from FIG. 3A), according to one or more disclosed implementations.

Referring now to FIG. 3D, standoff 361 and spring 362 which work in conjunction with standoff 361 are illustrated. When assembled, spring 362 will insert into node-housing 320 via opening 331 (shown in FIG. 3B) along with standoff 361 to allow the associated instance of node-housing 320 to maintain in and out (relative to spring 362) float for that node-housing 320. As explained further below, screw 505 of FIG. 5 may be inserted through opening 330 (from FIG. 3B) to couple node-housing 320 to standoff 361 and ultimately a PCB bracket (as illustrated in FIG. 5). Thus, a completed assembly (as illustrated in FIG. 5) will allow in and out movement (e.g., a linear movement along the standoff axis 335 controlled by spring 362) and partial rotational movement (controlled by brackets 340A and 340B) for each instance of node-housing 320. This in and out movement and partial rotational movement provides what is referred to herein as "float." In contrast, a connector without float may be referred to as having a "fixed" connection to an associated PCB (as in this example is provide for switch-side connectors that are explained in more detail next).

Figure 3E:
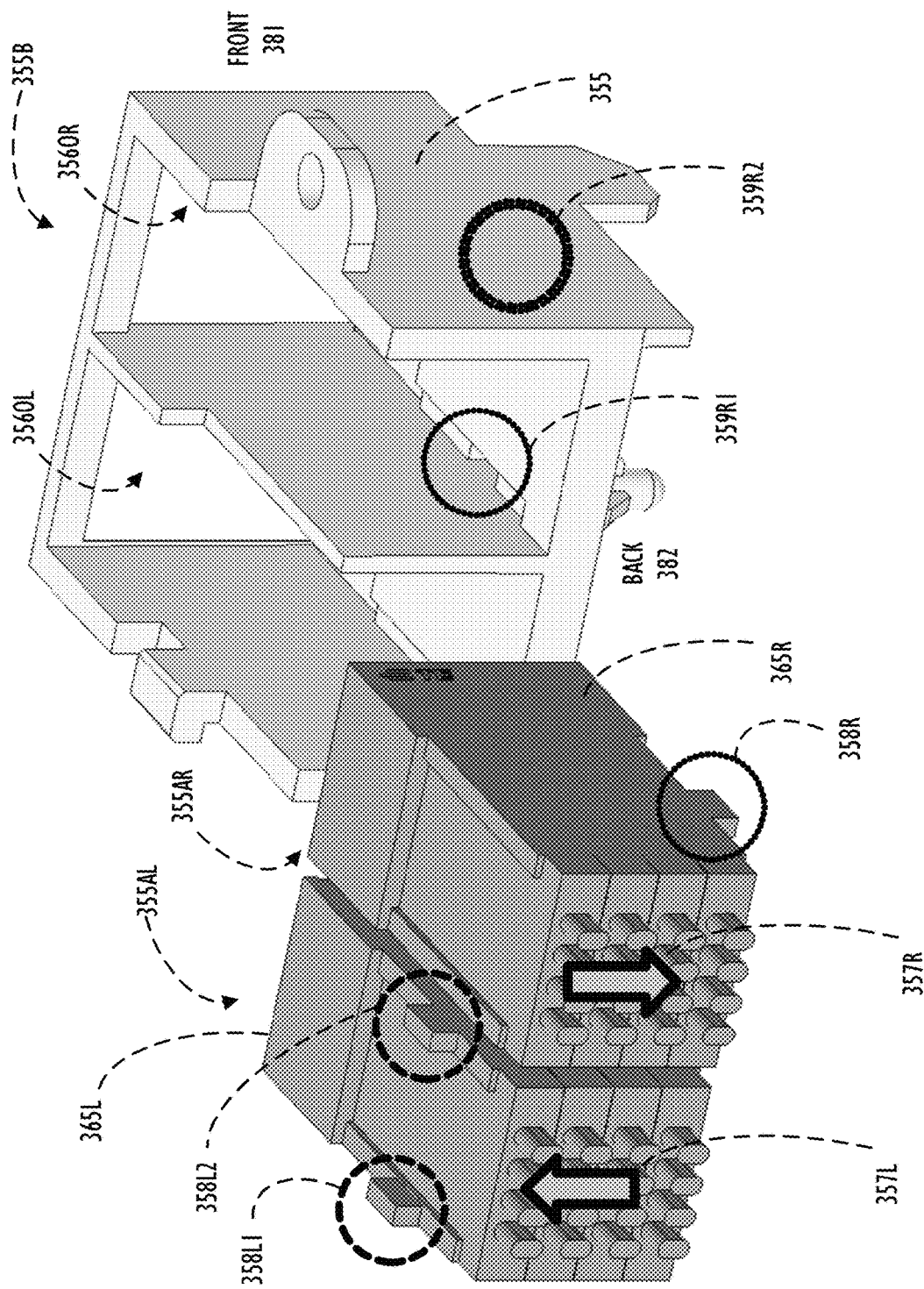
FIG. 3E illustrates a pair of switch-side connectors and an associated switch-housing to support blind mate connection to node-side connectors (e.g., FIG. 3A) where each of the pair of switch-side connectors has a different datum, according to one or more disclosed implementations.

Referring now to FIG. 3E, an exploded view for a pair of connectors 365L and 365R, which in this example are female connectors and illustrated as switch-side connectors, is illustrated with an associated switch-housing 355. Specifically, the connector 365L on the left side of FIG. 3E includes a face 355AL that is not visible in FIG. 3E (can be seen containing female connectors 380 in FIG. 3F) but aligns with left opening 356OL of switch-housing 355 and beveled face 355B of switch-housing 355. The female connector 365R on the right side of FIG. 3E includes a face 355AR that is also not visible in FIG. 3E but is to align with right opening 356OR of switch-housing 355. That is, each of the pair of connectors 365R and 365L of FIG. 3E will be inserted (as explained in more detail below) into switch-housing 355.

The back 382 of switch-housing 355, after assembly, will be substantially adjacent to PCB connector pins of each connector 365 that have different respective datums (e.g., data orientations). The connector 365L in the example of FIG. 3E has an upward datum orientation as illustrated by arrow 357L. The connector 365R in the example of FIG. 3E has a downward datum orientation as illustrated by arrow 357R. In this context, upward and downward have no meaning other than a relative orientation with respect to each other to indicate that the connectors are flipped relative to each other. That is, each of the two connectors 365L and 365R in FIG. 3E may be identical except for their orientation.

As illustrated in FIG. 3E, connector 365L may have tabs as indicated by tab 358L1 that is the first tab of the left connector 365L and tab 358L2 that is the second tab of the left connector 365L. Connector 365R is shown to have tab 358R which is the only visible tab of the right connector 365R and corresponds to tab 358L1 of the left connector 365L. Although not shown the right connector 365R would have a second tab corresponding to tab 358L2 but that tab is obstructed in this view. Each connector may also have more than one tab to be used for alignment and connection as is discussed for tabs 358 in this example.

Continuing with FIG. 3E, switch-housing 355 includes multiple recesses (e.g., that correspond upon assembly with tabs 358) that are not all visible in FIG. 3E. Recess 359R1 is the only fully visible recess in this view and will correspond to the tab of right connector 365R that is not visible in FIG. 3E but corresponds to tab 358L2 and that would be opposite tab 358R. The area where recess 359R2 is illustrated by an external circle on switch-housing 355. Wherever one of tabs 358 extends from an instance of a connector 365, switch-housing 355 will have a corresponding recess to allow for assembly of connectors 365 into switch-housing 355. These tabs and recesses, when used in combination, allow for proper alignment, orientation, and restriction of movement when connectors 365 are inserted into switch-housing 355. As mentioned throughout this disclosure, the designation of switch-housing and node-housing (along with male and female connectors) may be changed such that switch-side connections are male and node-side connections are female. The illustrations of the specific implementation being presented are only one example of many different possible implementations.

Figure 3F:
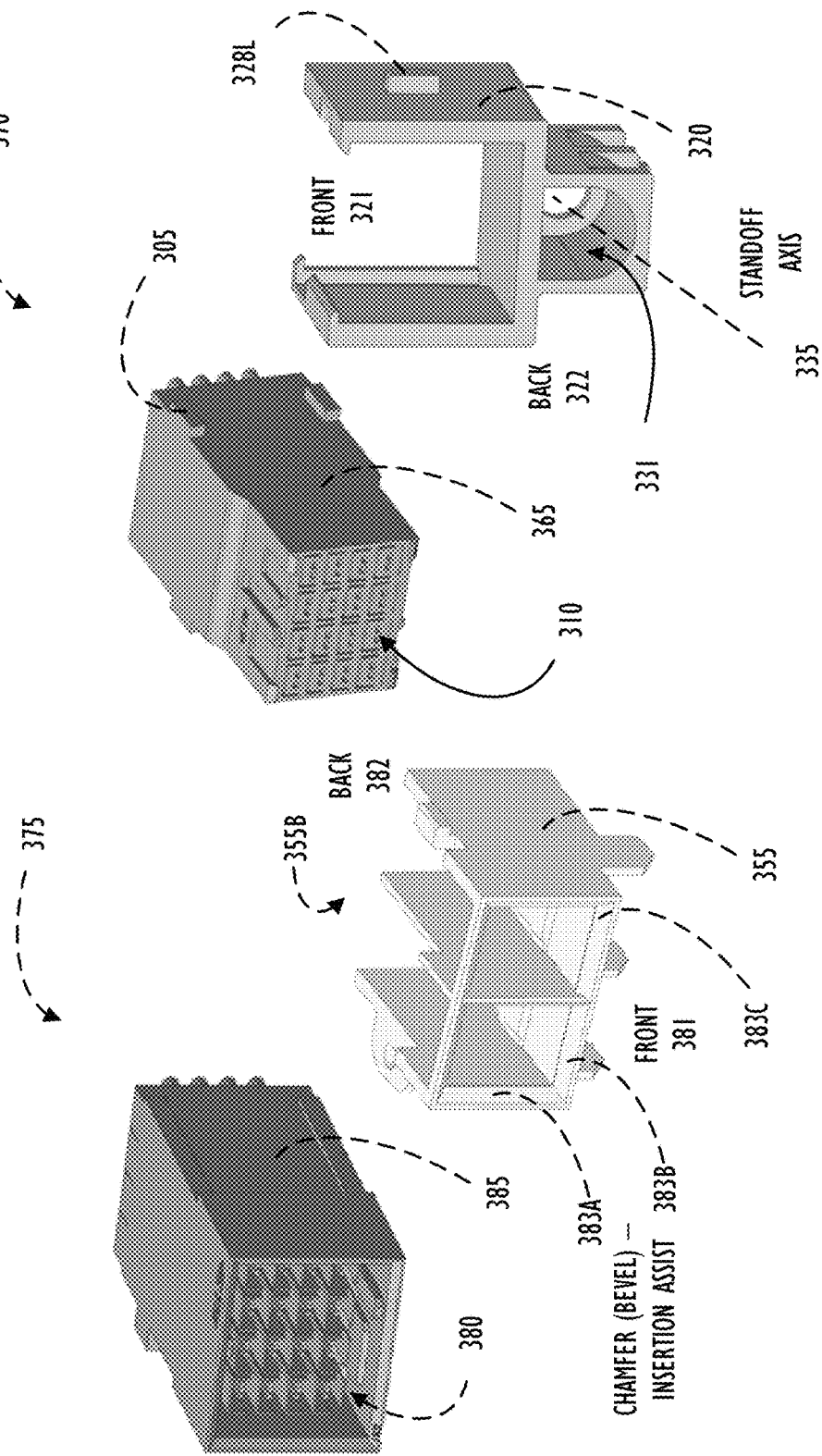
FIG. 3F illustrates sets of switch-side components and node-side components in exploded views, according to one or more disclosed implementations.

Referring now to FIG. 3F, a pair of switch-side components 375 (e.g., from FIG. 3E) are illustrated from a different perspective than that shown in FIG. 3E. For simplicity, only a single connector 385 (i.e., one instance of connectors 365 from FIG. 3E) is illustrated. Front face of connector 385 illustrates the female connectors 380 that are provided through one of openings 356OR or 356OL of FIG. 3E. Note that female connectors 380 individually may act as a male connector by inserting into a corresponding opening on a front face 310 of male connector 365 but are referred to as female connectors based on the overall context of this discussion. Specifically, the set of female connectors 380 may act as pins that insert into holes of male connector 365 but do not extend beyond the perimeter of connector 385 which is, overall, a female connector. Switch-housing 355 is also shown as part of switch-side components 375 and further illustrates a set of chamfers (e.g., bevels to assist in connection) along front 381 of housing 355. Specifically, chamfer 383A is illustrated along one vertical edge of switch-housing 355 and chamfers 383B and 383C are shown along a bottom edge for respective connectors (after assembly). Although not specifically called out in FIG. 3F (e.g., based on the orientation of the view) other chamfers may also exist around all perimeter edges of front openings for switch-housing 355 (See FIG. 4).

Continuing with FIG. 3F, a pair of node-side components 370 are also illustrated. As shown, node-side components illustrate male connector 365 having a set of visible tabs (i.e., one instance is tab 305) and the front face 310 that receives connection pins from female connector 385 as discussed above. Node-housing 320 in FIG. 3F illustrates elements that have previously been discussed and maintain their same reference numbers.

Figure 4:
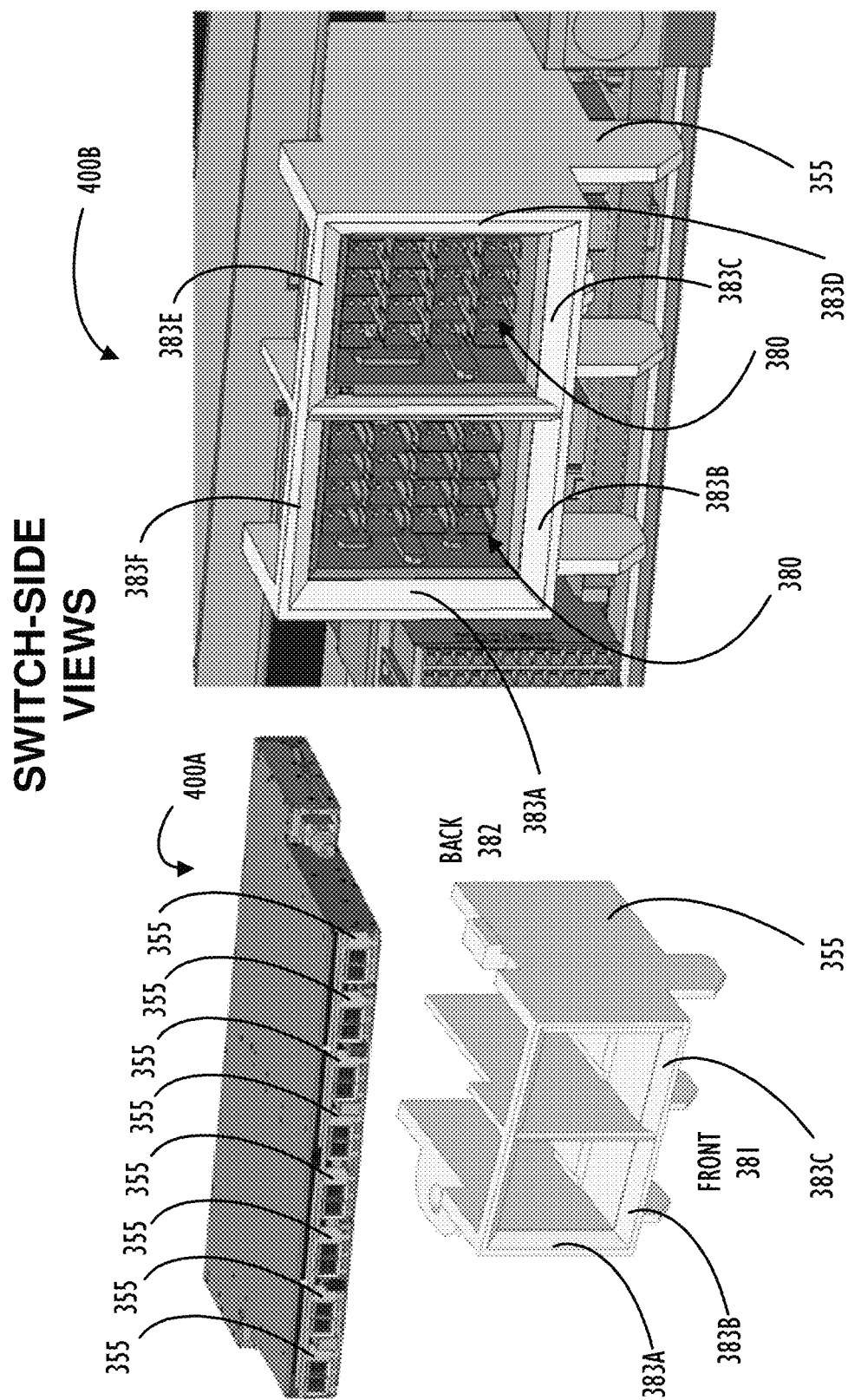
FIG. 4 illustrates a switch tray and relative location of a switch-side switch-housing with respect to the switch tray for the switch-side components, according to one or more disclosed implementations.

Referring now to FIG. 4, a set of switch-side views are illustrated to provide associative context for components previously discussed. Switch tray 400A is illustrated and includes eight (8) instances of switch-housing 355 after assembly. Switch-housing 355 is again illustrated and includes chamfer edges 383A-C. Closeup view 400B represents a single instance of the switch-housings 355 from switch tray 400A. In closeup view 400B, additional bevel edges 383D, 383E, and 383F for switch-housing 355 are visible. Closeup view 400B also illustrates a pair of female connectors 380 as they would be presented on the back of the switch tray.

Referring now to FIG. 5, a node-side view of an un-twinned node-tray PCB 500 is illustrated. Un-twinned node-tray PCB 500 includes multiple instances of node-housing 320, each instance including a male connector 365 and screw 505 (that would be inserted along standoff axis 335 discussed above. In FIG. 5, a distance and float for connector 365 of node-housing 320 is provided by standoff 361 (from FIG. 3D) as indicated at standoff area 361A. Additional connectors to a midplane 150 as discussed above are illustrated as connections 515. Recall that, upon insertion, of a twinned node tray as discussed throughout this disclosure (see FIG. 6) connections to a midplane may be formed substantially concurrently with connectors forming connections between node trays and switch trays as they are inserted and properly fully seated within a chassis (see FIGS. 1-2).

Figure 6:
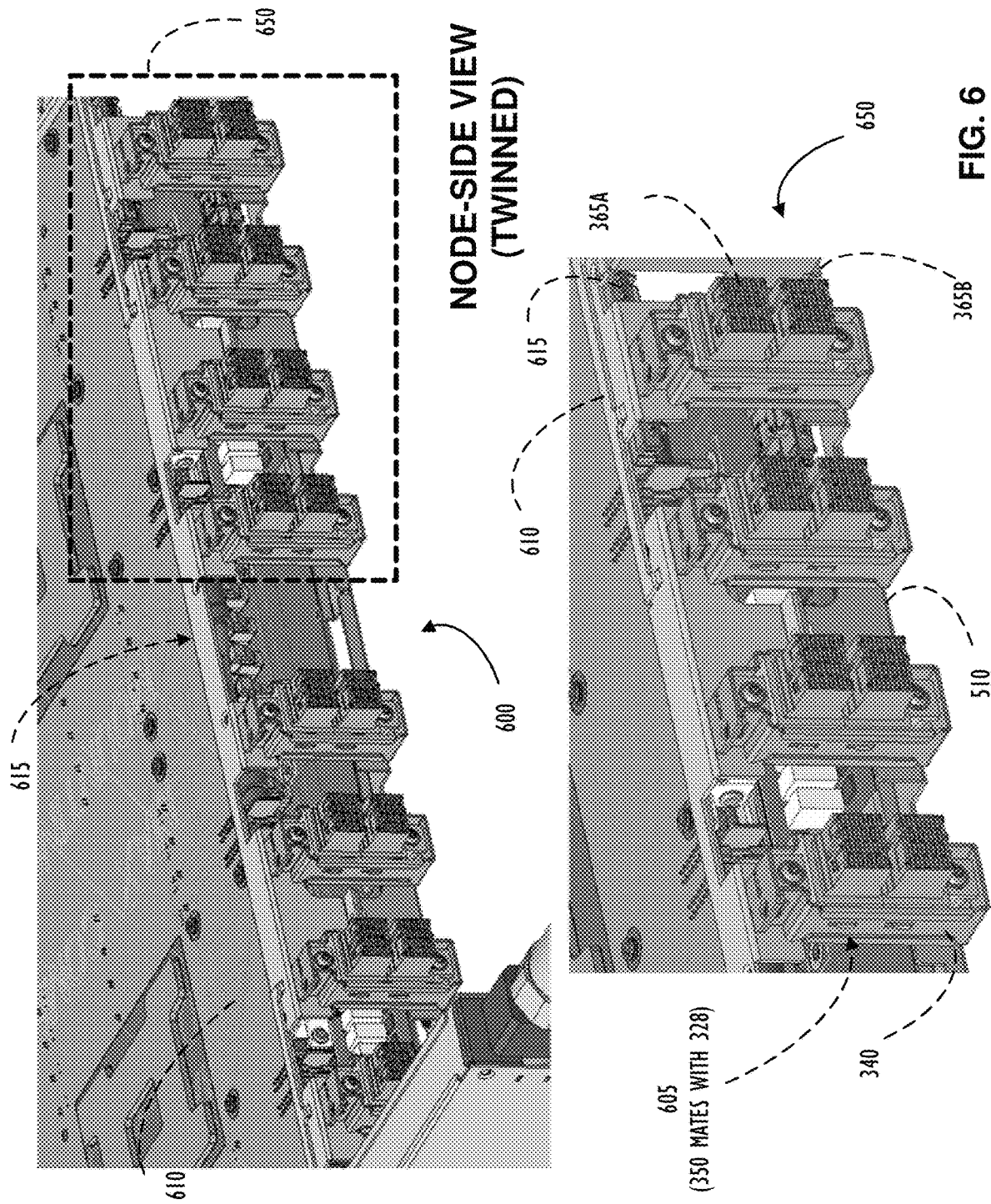
FIG. 6 illustrates an example node-side view of twinned (i.e., dual) PCBs of a node-side tray (i.e., node tray) having pairs of male blind mate connectors (e.g., from FIG. 3A) where rotational movement of each pair may be controlled via a bracket, according to one or more disclosed implementations.

Referring now to FIG. 6, a node-side view of a twinned pair of PCBs forming a node tray 600 is illustrated. Area 650 is illustrated in an expanded view at the bottom of FIG. 6. PCB to midplane connectors 615 are illustrated as examples of connectors that may be formed in addition to the node-switch connectors discussed throughout this disclosure. PCB 610 forms the top of the twinned pair and PCB 510 forms the bottom of the twinned pair that together form a single node tray. As illustrated in enlarged area 650, bracket 605 illustrates an example of how bracket opening of side holes 350 on bracket 340 mates with tab 328 as was discussed above with reference to FIGS. 3B and 3C. Thus, as explained above, external brackets (e.g., 340A and 340B as illustrated in FIG. 3C) may surround a pair of twinned male connectors (i.e., connector 365A and connector 365B in this example) and control rotational movement around a standoff axis (e.g., standoff axis 335 discussed above) to provide an amount of in and out float to the pair of connectors.

Figure 7:
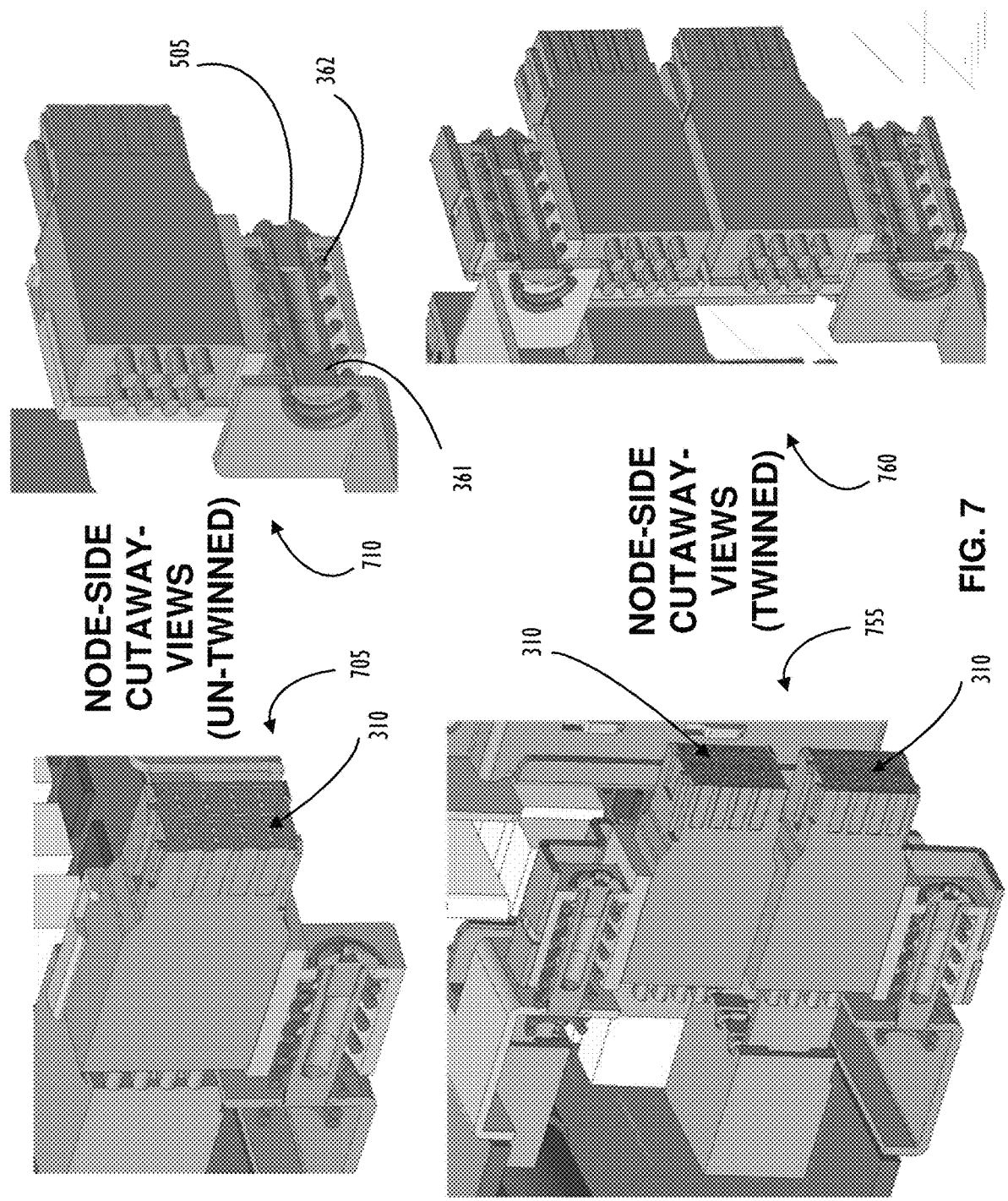
FIG. 7 illustrates several node-side cutaway views of un-twinned and twinned PCBs to illustrate internal associations of node-side components, according to one or more disclosed implementations.

Referring now to FIG. 7, four different cut-away views are illustrated. First cut-away view 705 illustrates an un-twinned male connector (e.g., male connector 365) having front face 310 that receives connection pins from female connector 385 as discussed above. Second cut-away view 710 illustrates screw 505, spring 362, and standoff 361 and their operational association. Third cut-away view 755 illustrates a pair of twinned connectors with a pair of exposed front face 310 instances and their relative orientation. Finally, fourth cut-away view 760 illustrates a view of the PCB side for the pair of twinned connectors.

Figure 8:
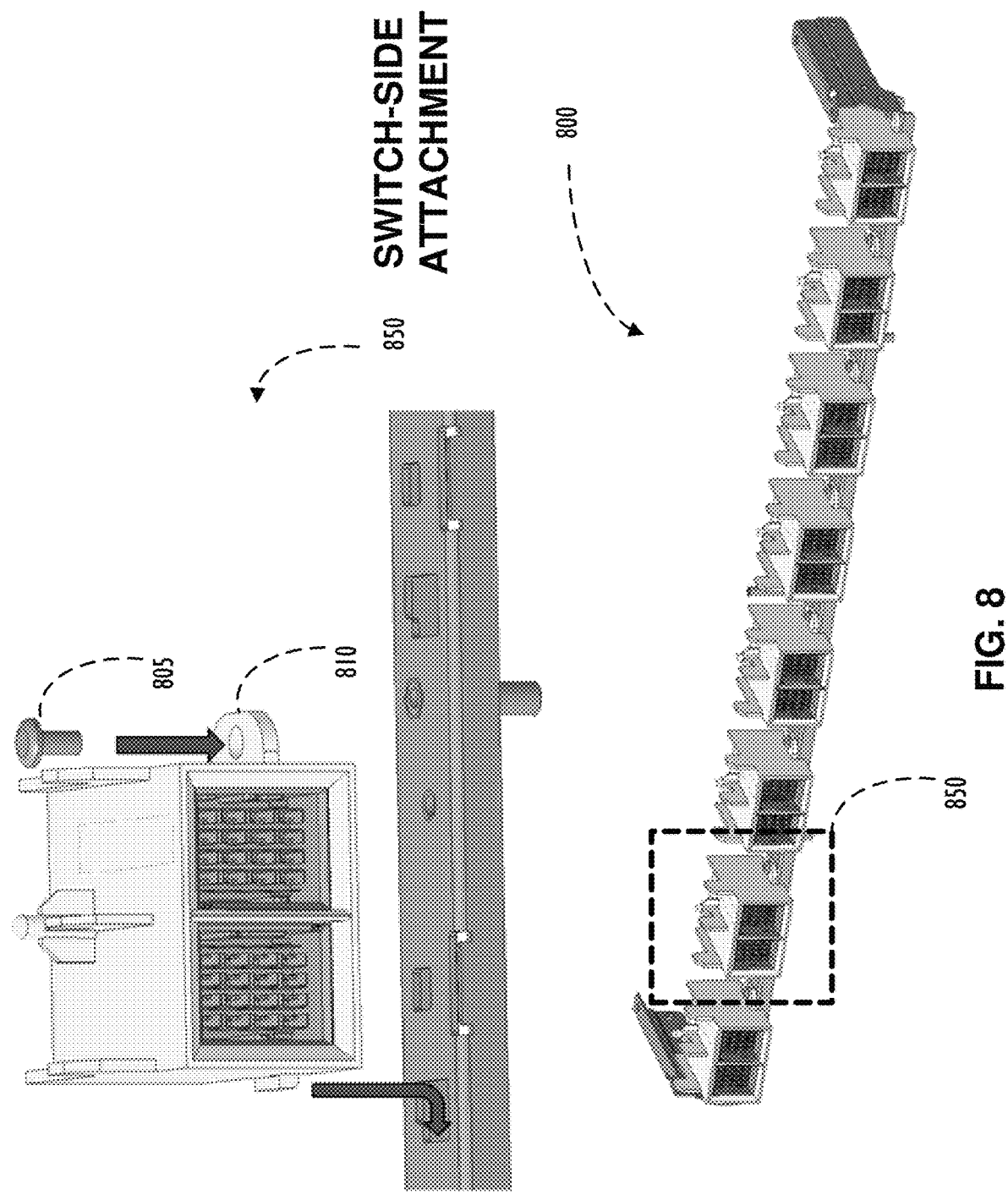
FIG. 8 illustrates possible switch-side attachments of female blind mate connector pairs, according to one or more disclosed implementations.

Referring now to FIG. 8, switch-side attachments are illustrated as an example of how switch-housing 355 (which is a fixed as opposed to a floating connection in this example) may be connected to a switch tray frame portion 800. As illustrated, a tab 810 and screw 810 may be used to fixedly connect an assembled set of switch-side components (See FIG. 3F) to a frame portion 800 of a switch tray. View 850 illustrates a closeup view of a portion of the eight (8) pairs of connectors provided on a switch tray frame portion 800 in the disclosed example.

Figure 9:
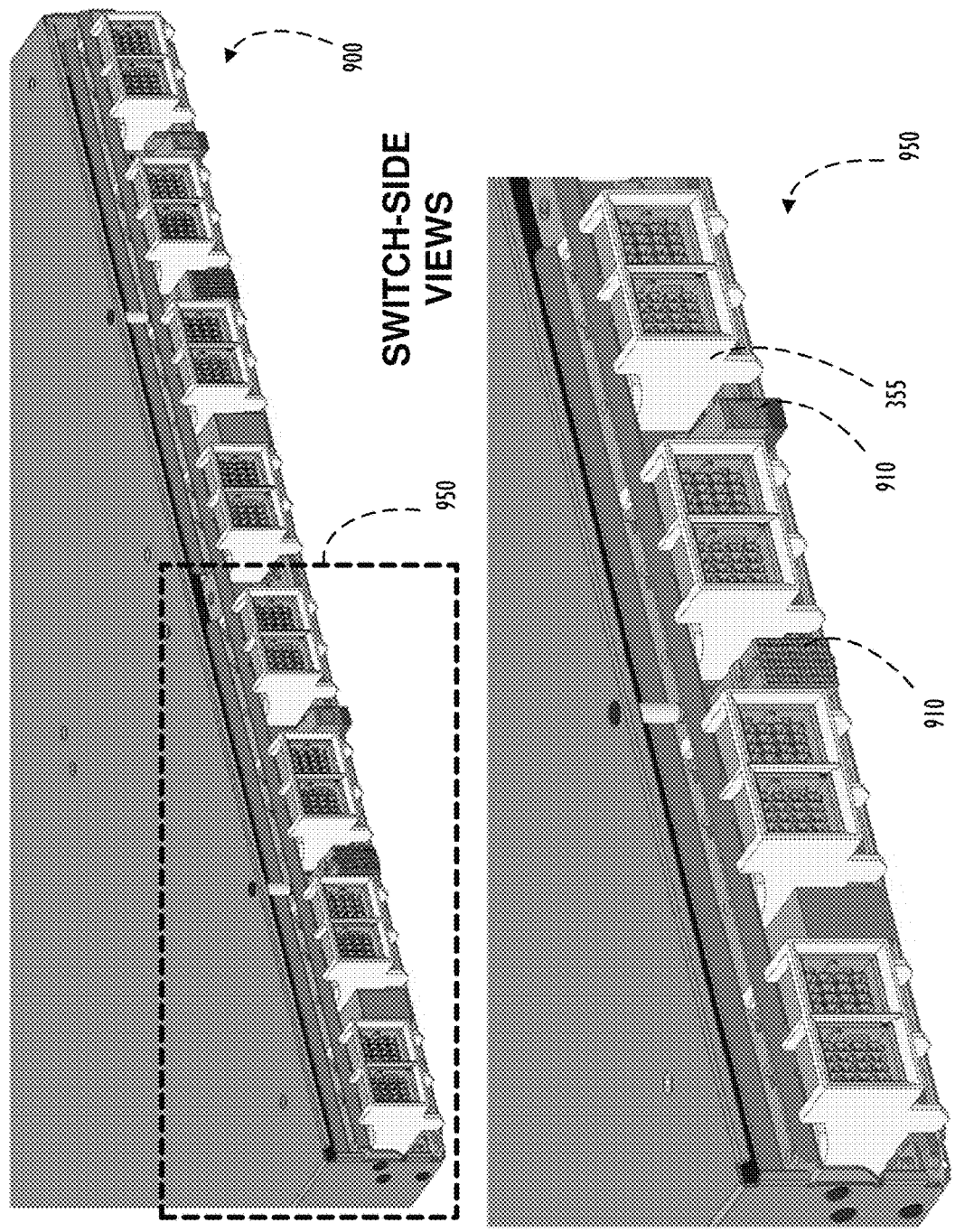
FIG. 9 illustrates an assembled switch-side view of the connectors of FIG. 8, according to one or more disclosed implementations.

Referring now to FIG. 9, the components of FIG. 8 are illustrated in the context of switch tray 900. FIG. 9 includes a full view of switch tray 900 and its eight (8) pairs of connectors and a closeup view 950 of a portion of switch tray 900. In closeup view 950 examples of possible midplane connectors 910 (note different types of midplane connectors 910 are illustrated) along with examples of switch-housing 355 are illustrated.

The above overview explains both: a) midplanes with openings (e.g., midplane 150) positioned at a midpoint of a chassis (explained in FIGS. 1-2) and b) connectors from trays (e.g., node trays and switch trays) that are inserted into the chassis from different directions and orientations. Accordingly, the disclosed blind mate connectors and connection techniques may be understood to provide many benefits to those of skill in the art having the benefit of this disclosure.

Multiple connectors may be adjacently connected to a PCB leaving a space in-between adjacent connectors of that PCB. Multiple PCBs may be "twinned" to form a twinned pair of PCBs that have a set of connectors that alternate between a first of the PCBs and a second of the PCBs that form the pair. As used herein "twinned" refers to aligning two PCBs each with an inverted orientation relative to the other such that components of each PCB may be interleaved and reduce overall space utilization for the two PCBs. Accordingly, each of the connectors may have a different set of datums (e.g., a different relative orientation) relative to adjacent connectors (i.e., a connector from the twinned PCB). The different datums and the twinning of the two printed circuit boards ("PCBs") allows the pair of PCBs to form a "tray" that may then be inserted (e.g., like a drawer) into a slot of the chassis. Twinning of a pair of PCBs and interleaving of connectors with different sets of datums was discussed further with reference to in FIGS. 5-7.

Also, as explained above, the blind made connection technique of this disclosure is facilitated by several physical characteristics of the disclosed connectors and their associated housings. Each connector may be attached to the PCB utilizing a spring and offset feature provided by a standoff on a respective PCB to allow an individual connector to have a "float" and allow for improved insertion tolerance. Each connector pair, when connected internally to a chassis, may pass through an opening in the midplane and simultaneously be mated with another pair of connectors on the other side of the midplane while the twinned PCBs are mated to the midplane itself (e.g., at points adjacent to openings). The combination of spring-loaded force in a first direction and chamfer (e.g., bevel) on each connector from the other direction provide reduction in competing connector engagements. For example, it may be easier to properly insert and mate the two PCBs through the midplane to a set of connectors on the other side of the opening. To assist in float a set of brackets provide for rotational brakes that control rotational movement that might otherwise be allowed by the spring/offset feature and assist in proper engagement of the blind mate connector. The float feature provided by the combination of spring, standoff, and rotational brakes represents an improvement to allow for lesser stack space and increase overall stacking tolerances internal to a chassis.

Different tray orientations allow for a single node tray to connect simultaneously with one or more switch trays. The number of node trays and switch trays within a given chassis may allow a chassis to be configured with different amounts of compute power and different amounts of network throughput and thus allow for increased configurability for system administrators. For example, a system administrator may create a chassis to provide substantial compute power with less network capability (e.g., for a compute intensive server), create a chassis to provide substantial network capability with less compute power (e.g., for a web server or other high network low compute application), or for a chassis that has relatively balanced network and compute capabilities.

In one example implementation, a blind mate connector assembly includes a male multi-pin connector in a retainer housing substantially surrounding the male multi-pin connector. The retainer housing includes a plurality of tab-stops (e.g., in the form of recesses) to secure the male multi-pin connector within the retainer housing and a mounting portion defining an opening to be used to attach to a PCB. A standoff is disposed in the opening with a spring surrounding (or internal to) the standoff, the spring within the opening to provide a spring-loaded mounting for the retainer and to provide a spring-loaded connection to a mating connector upon engagement with a second female connector. To address rotational movement of the male connector, a pair of rigid brackets, including a left-side bracket and a right-side bracket, may be mounted external to and to restrain rotation of the retainer housing upon the connector engaging a mating female connector. The male multi-pin connector may be twinned with another male multi-pin connector, within the retainer bracket pair, to allow two male multi-pin connectors to be formed into a single paired assembly for insertion into a fixed pair of female receiving connectors through an opening of a midplane PCB of a computer chasses.

The connectors on the male and female sides may be Whisper connectors. The two sets of connectors that meet through the midplane may be provided with an associated tray to be slid into the chassis similar to a drawer sliding into a cabinet. One or more of the trays may include a pair of twinned printed circuit boards ("PCBs") oriented inversely to each other and connected to each other for complimentary insertion into the chassis, the pair of twinned PCBs may include a first PCB having a first subset of blind mate connectors in a first orientation and a second PCB having a second subset of blind mate connectors in a second orientation 180° relative to the first orientation. Thus, different datums for the connections may be provided and be coordinated with the twinning aspect of the multiple PCBs.

In some cases, a server chassis, may include a midplane as a printed circuit board (e.g., PCB) disposed within the server chassis, the midplane board may include a plurality of openings that are each adjacent to midplane connection points. The openings and the adjacent midplane connection points may be configured to receive a first tray (e.g., node tray or switch tray) on a first side of the midplane board (i.e., inserted from one side of the chassis) and a second tray (e.g., a switch tray) on a second side of the midplane board (i.e., opposite the side the first tray was inserted from. Each of the trays may include the pairs of blind mate connectors discussed herein to allow connection at a midpoint of the chassis between the two trays concurrent with attachments to the midplane board. The two trays may be at 90 degrees off alignment with respect to each other to allow each of the trays of the first tray type to concurrently connect to multiple connectors from different instances of trays of the second tray type. For example, a node tray may concurrently plug into multiple switch trays.

In one example from 1 to 8 node trays may plug into 1 to 8 switch trays of a single chassis. Either switch trays or node trays may have a fixed set of connectors with the opposing tray having a set of connectors configured with float as discussed herein. The fixed connectors may include additional connection guides in the form of chamfers to provide an alignment of a spring-loaded male connector while being inserted into a female fixed connector. The combination of float and fixed connectors to increase stacking tolerance as additional trays are inserted into a single chassis.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various implementations of the present disclosure. Numerous variations and modifications will become apparent to those skilled in the art once the above disclosure is fully appreciated. It is intended that the following claims be interpreted to embrace all such variations and modifications.

What is claimed is:

1. A blind mate connector assembly for a first printed circuit board (PCB), comprising:
   a male multi-pin connector;
   a retainer housing substantially surrounding the male multi-pin connector, the retainer housing comprising:
      a plurality of tab-stops to secure the male multi-pin connector within the retainer housing; and
      a mounting portion defining an opening;
   a standoff disposed in the opening;
   a spring disposed on the standoff and within the opening to provide a spring-loaded mounting for the retainer housing and a spring-loaded connection to a mating connector upon engagement with the mating connector, the mating connector being a female multi-pin connector on a second PCB;
   a pair of brackets including a left-side bracket and a right-side bracket, the pair of brackets external to and restraining rotation of the retainer housing upon the connector engaging the mating connector; and
   a fastener affixing the retainer housing to the standoff when assembled.

2. The blind mate connector assembly of claim 1, wherein the multi-pin connector is a Whisper connector.

3. The blind mate connector assembly of claim 1, wherein the pair of brackets are made of a flexible material to allow at least some rotational movement for the housing.

4. The blind mate connector assembly of claim 1, wherein the pair of brackets are made of a rigid material and an amount of allowed rotational movement that is determined by how tightly the pair of brackets are to surround the retainer housing.

5. The blind mate connector assembly of claim 1, wherein the spring and the standoff provide for an in and out linear movement of the housing.

6. The blind mate connector assembly of claim 5, wherein a tension of the spring defines pressure with respect to the in and out movement of the housing.

7. A node tray for a chassis to connect through a midplane of the chassis to a switch tray of the chassis using a plurality of node-side blind mate connectors, the node tray comprising:
   a pair of twinned printed circuit boards ("PCBs") oriented inversely to each other and connected to each other for simultaneous insertion into the chassis, the pair of twinned PCBs including a first PCB having a first subset of male node-side blind mate connector assemblies in a first orientation and a second PCB having a second subset of male node-side blind mate connector assemblies in a second orientation 180° relative to the first orientation;
   each of the instances of the first subset paired with an instance of the second subset to form a pair of twinned node-side male blind mate connectors, the pair comprising:
      a first male multi-pin connector and a second male multi-pin connector;
      a respective housing substantially surrounding both the first and second male multi-pin connectors, each respective retainer housing comprising:
         a plurality of tab-stops to secure the respective male multi-pin connector within the respective retainer housing; and
         a mounting portion defining an opening;
      an associated standoff for each of the respective housings disposed within the opening;
      a spring disposed on the standoff and within the opening to provide a spring-loaded mounting for the respective retainer housing and a spring-loaded connection to a mating connector upon engagement with the mating connector, the mating connector being a female multi-pin connector on a third PCB, the third PCB separate from the node tray;
      a pair of brackets including a left-side bracket and a right-side bracket, the pair of brackets external to and restraining rotation of the respective retainer housings upon the first male multi-pin connector and a second male multi-pin connector engaging the mating connector; and
      a fastener affixing each respective retainer housing to the associated standoff when assembled.

8. The node tray of claim 7, wherein the male node-side multi-pin connector is a Whisper connector.

9. The node tray of claim 7, wherein the pair of brackets are made of a flexible material to allow at least some rotational movement concurrently for the respective housings.

10. The node tray of claim 7, wherein the pair of brackets are made of a rigid material and amount of allowed rotational movement is determined by how tightly the pair of brackets are to surround the respective retainer housings.

11. The node tray of claim 7, wherein the spring and standoff provide for an in and out movement of the respective retainer housings individually.

12. The node tray of claim 11, wherein a tension of the spring defines pressure with respect to the in and out movement of the respective housing.

13. A server chassis, comprising:
   a midplane board disposed within the server chassis, the midplane board defining a plurality of openings adjacent to midplane connection points;
   a node tray on a first side of the midplane board;
   a switch tray on a second side of the midplane board, the second side opposite the first side; and
   a plurality of blind mate connectors on each of the node tray and the switch tray to connect to respective connectors through the midplane board simultaneously with each of the node tray and the switch tray being connected to the midplane board, wherein the node tray and the switch tray are at 90 degrees off alignment with respect to each other when installed in the server chassis.

14. The server chassis of claim 13, wherein at least a subset of the plurality of blind mate connectors comprise:
   a male multi-pin connector;
   a retainer housing substantially surrounding the male multi-pin connector, the retainer housing comprising:
      a plurality of tab-stops to secure the male multi-pin connector within the retainer housing; and
      a mounting portion defining an opening;
   a standoff disposed in the opening;
   a spring disposed on the standoff and within the opening to provide a spring-loaded mounting for the retainer housing and a spring-loaded connection to a mating connector upon engagement with the mating connector, the mating connector being a female multi-pin connector on the switch tray;
   a pair of brackets including a left-side bracket and a right-side bracket, the pair of brackets external to and restraining rotation of the retainer housing upon the connector engaging the mating connector; and
   a fastener affixing the retainer housing to the standoff when assembled.

15. The server chassis of claim 13, wherein the plurality of blind mate connectors on the node tray utilize at least two different datums.

16. The server chassis of claim 15, wherein the two different datums are 180 degrees offset from each other and are consistent with a respective one of a paired PCB in the node tray.

17. The server chassis of claim 13, further comprising:
   at least one of eight potential node trays plugging into the midplane; and
   at least one of eight potential switch trays plugging into both the midplane and at least one blind mate connector, from the plurality of blind mate connectors, of each installed switch tray, each installed one of the eight potential switch trays oriented at 90 degrees off alignment from each installed node trays.

18. The server chassis of claim 17, wherein switch tray connectors are fixed to have no float and node tray connectors utilize float.

19. The server chassis of claim 18, wherein the switch tray connectors each include at least one edge with a chamfer.

* * * * *